United States Patent
Collins et al.

(10) Patent No.: US 10,615,004 B2
(45) Date of Patent: Apr. 7, 2020

(54) DISTRIBUTED ELECTRODE ARRAY FOR PLASMA PROCESSING

(71) Applicant: Applied Materials, Inc., Santa Clara, CA (US)

(72) Inventors: Kenneth S. Collins, San Jose, CA (US); Michael R. Rice, Pleasanton, CA (US); Kartik Ramaswamy, San Jose, CA (US); James D. Carducci, Sunnyvale, CA (US); Yue Guo, Redwood City, CA (US); Olga Regelman, Daly City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/432,930

(22) Filed: Jun. 6, 2019

(65) Prior Publication Data

US 2019/0287765 A1   Sep. 19, 2019

Related U.S. Application Data

(63) Continuation of application No. 16/107,855, filed on Aug. 21, 2018, which is a continuation of application (Continued)

(51) Int. Cl.
*H01J 37/32* (2006.01)

(52) U.S. Cl.
CPC ..... *H01J 37/32174* (2013.01); *H01J 37/3211* (2013.01); *H01J 37/3244* (2013.01); *H01J 37/32165* (2013.01); *H01J 37/32568* (2013.01)

(58) Field of Classification Search
None
See application file for complete search history.

(56) References Cited

U.S. PATENT DOCUMENTS 6,313,430 B1   11/2001   Fujioka et al.
6,353,201 B1    3/2002   Yamakoshi et al.
(Continued)

FOREIGN PATENT DOCUMENTS

CN   103917035 A   7/2014
JP    09139380 A   5/1997
(Continued)

OTHER PUBLICATIONS

Chang, T.H. et al; Generating large-area uniform microwave field for plasma excitation; Physics of Plasmas 19, 033302 (2012); doi: 10.1063/1.3692231; http://dx.doi.org/10.1063/1.3692231.
(Continued)

*Primary Examiner* — Dedei K Hammond
(74) *Attorney, Agent, or Firm* — Patterson + Sheridan LLP

(57) ABSTRACT

Embodiments of the disclosure provide a plasma source assembly and process chamber design that can be used for any number of substrate processing techniques. The plasma source may include a plurality of discrete electrodes that are integrated with a reference electrode and a gas feed structure to generate a uniform, stable and repeatable plasma during processing. The plurality of discrete electrodes include an array of electrodes that can be biased separately, in groups or all in unison, relative to a reference electrode. The plurality of discrete electrodes may include a plurality of conductive rods that are positioned to generate a plasma within a processing region of a process chamber. The plurality of discrete electrodes is provided RF power from standing or traveling waves imposed on a power distribution element to which the electrodes are connected.

20 Claims, 25 Drawing Sheets

Related U.S. Application Data

No. 16/059,608, filed on Aug. 9, 2018, now Pat. No. 10,312,056.

(60) Provisional application No. 62/543,769, filed on Aug. 10, 2017.

(56) References Cited

U.S. PATENT DOCUMENTS

| | | |
|---|---|---|
| 6,456,010 B2 | 9/2002 | Yamakoshi et al. |
| 6,503,816 B2 | 1/2003 | Ito et al. |
| 7,001,831 B2 | 2/2006 | Niira et al. |
| 7,205,034 B2 | 4/2007 | Kawamura et al. |
| 7,833,587 B2 | 11/2010 | Mashima et al. |
| 7,868,517 B2 | 1/2011 | Belot et al. |
| 8,129,912 B2 | 3/2012 | Ko et al. |
| 8,607,733 B2 | 12/2013 | Tachibana |
| 9,165,748 B2 | 10/2015 | Takagi et al. |
| 9,355,821 B2 | 5/2016 | Chen et al. |
| 9,396,900 B2 | 7/2016 | Lane et al. |
| 9,419,583 B2 | 8/2016 | Rinaldi et al. |
| 9,431,217 B2 | 8/2016 | Mai et al. |
| 9,711,330 B2 | 7/2017 | Bera |
| 9,712,136 B2 | 7/2017 | Rinaldi et al. |
| 9,935,608 B1 | 4/2018 | Rinaldi et al. |
| 2003/0129107 A1 | 7/2003 | Denes et al. |
| 2005/0067934 A1 | 3/2005 | Ueda et al. |
| 2010/0239757 A1 | 9/2010 | Murata |
| 2016/0120013 A1* | 4/2016 | Imai .................. H05H 1/48 315/111.21 |

FOREIGN PATENT DOCUMENTS

| | | | | |
|---|---|---|---|---|
| JP | 2002-198355 A | | 7/2002 | |
| JP | 2006-134606 A | | 5/2006 | |
| KR | 1020140194862 | * | 12/2014 | ............ H01L 21/02 |
| KR | 10-2017-0039557 A | | 4/2017 | |

OTHER PUBLICATIONS

Chen, Hsin-Liang et al; Generation of uniform large-area very high frequency plasmas by launching two specific standing waves simultaneously; Journal of Applied Physics 116, 103307 (2014); doi: 10.1063/1.4895703; http://dx.doi.org/10.1063/1.4895703.

Goya, Saneyuki et al; Development of Amorphous Silicon/ Microcrystalline Silicon Tandem Solar Cells; 3rd World Conference on Photovoltaic Energy Conversion May 11-18, 2003 Osaka, Japan; pp. 1570-1573.

Hwang, Doo Sup et al; Dual comb-type electrodes as a plasma source for very high frequency plasma enhanced chemical vapor deposition; Thin Solid Films 518 (2010) 2124-2127.

Ito, Norikazu et al.; Large Area Deposition of Hydrogenated Amorphous Silicon by VHF_PECVD Using Novel Electrodes; IEEE, 2000; pp. 900-903.

Noda, Matsuhei et al; Large Area Thin Film SI Tandem Module Production Using VHF Plasma with a Ladder-Shaped Electrode; 3rd World Conference on Photovoltaic Energy Conversion May 11-18, 2003 Osaka, Japan; pp. 1849-1851.

Meiling, H. et al; Film Uniformity and Substrate-to-Electrode Attachment in Large-Area VHF Glow-Discharge Deposition of a-Si:H; IEEE; 25th PVSC; May 13-17, 1996; Washington, D.C.; pp. 1153-1156.

He, D. et al.; Longitudinal voltage distribution in transverse rf discharge waveguide lasers; Journal of Applied Physics 54, 4637 (1983); doi: 10.1063/1.332673; http://dx.doi.org/10.1063/1.332673; pp. 4367-4373.

Livesay, W. R.; Largearea electronbeam source; Journal of Vacuum Science & Technology B 11, 2304 (1993); doi: 10.1116/1.586895; http://dx.doi.org/10.1116/1.586895; pp. 2304-2308.

Mashima, Hiroshi et al; Characteristics of Very High Frequency Plasma Produced Using a Ladder-Shaped Electrode; Jpn. J. Appl. Phys. vol. 38 (1999) pp. 4305-4308.

Mashima, H. et al; Large area VHF plasma production using a ladder-shaped electrode; Thin Solid Films 506-507 (2006) 512-516.

Morrison et al; Deposition of Microcrystalline Silicon Films and Solar Cells Via The Pulsed PECVD Technique; IEEE, 2002, pp. 1102-1104.

Tarasa, Ralf et al; PECVD of Doped and Intrinsic A-Si:H Layers for Solar Cell Structures Using a (Novel) Inline Ddeposition System; IEEE, pp. 1528-1531.

Anders, Andre; Plasma and Ion Sources in Large Area Coatings: A Review; ICMCTF 2005, LBNL-57127; pp. 1-42.

Satake, Koji; Experimental and numerical studies on voltage distribution in capacitively coupled very high-frequency plasmas; Plasma Sources Sci. Technol. 13 (2004) 436-445.

Sato, Hiroyasu et al; Design of Folded Monopole Array Antenna Used For Large Area Plasma Production; IEEE, pp. 1026-1029.

Schmidt, H.; Improving plasma uniformity using lens-shaped electrodes in a large area very high frequency reactor; Journal of Applied Physics 95, pp. 4559-4564 (2004); doi: 10.1063/1.1690096; http://dx.doi.org/10.1063/1.1690096.

Stephan, U. et al; Large Area Deposition Technique For PECVD Of Amorphous Silicon; IEEE, 26th PVSC; Sep. 30-Oct. 3, 1997; Anaheim, CA, pp. 647-650.

Wei, Yu et al; Linear Plasma Sources for Large Area Film Deposition: A Brief Review;Plasma Science and Technology, vol. 16, No. 4, Apr. 2014, pp. 356-362.

Takagi, Tomoko et al; Large Area Multi-Zone Type VI-IF-PCVD System for a-Si and pc-Si Deposition; 3rd World Conference on Photovoltaic Energy Conversion May 11-18, 2003 Osaka, Japan, pp. 1792-1795.

Yamauchi, Yashuiro et al; Develoment of a-Si/Micro-crystalline—Si Tandem-type Photovoltaic Solar Cell; Technical Review vol. 42 No. 3 (Oct. 2005); pp. 1-5.

Yamauchi, Yashuiro et al; High Efficiency Large Area Solar Module in Mitsubishi Heavy Industries; Technical Review vol 41 No. 5 (Oct. 2004), pp. 1-4.

Wu, Yaoxi et al; A traveling wave-driven, inductively coupled large area plasma source; Appl. Phys. Lett., vol. 72, No. 7, Feb. 16, 1998; pp. 777-779.

Wu, Yaoxi et al; The influence of antenna configuration and standing wave effects on density profile in a large-area inductive plasma source, Plasma Sources Sci. Technol. 9 (2000) 210-218.

Whitehair, Stan; Plasmaline Large Area Plasma Systems; Cober Electronics, Inc. Presentation.

Schmidt, Hannes; Characterization of a High-Density, Large-Area VHF Plasma Source; Thesis—Ecole Polytechnique Federale De Lausanne; Apr. 21, 2006; pp. 1-154.

Chen, Hsin-Liang et al; Generation of Uniform Large Area VHF Plasmas by Launching a Travelling Wave; <http://onlinelibrary.wiley.com/wol1/doi/10.1002/ppap.201300101/full>,.

PCT International Serch Report and Written Opinion of the International Searching Authority for PCT/US2018/045939, dated Nov. 29, 2018, 8 pages.

Hollenstein, Ch et al; Resonant RF network antennas for large-area and large-volume inductively coupled plasma sources; Plasma Sources Science Technology 22 (2013) 055021 (10pp).

* cited by examiner

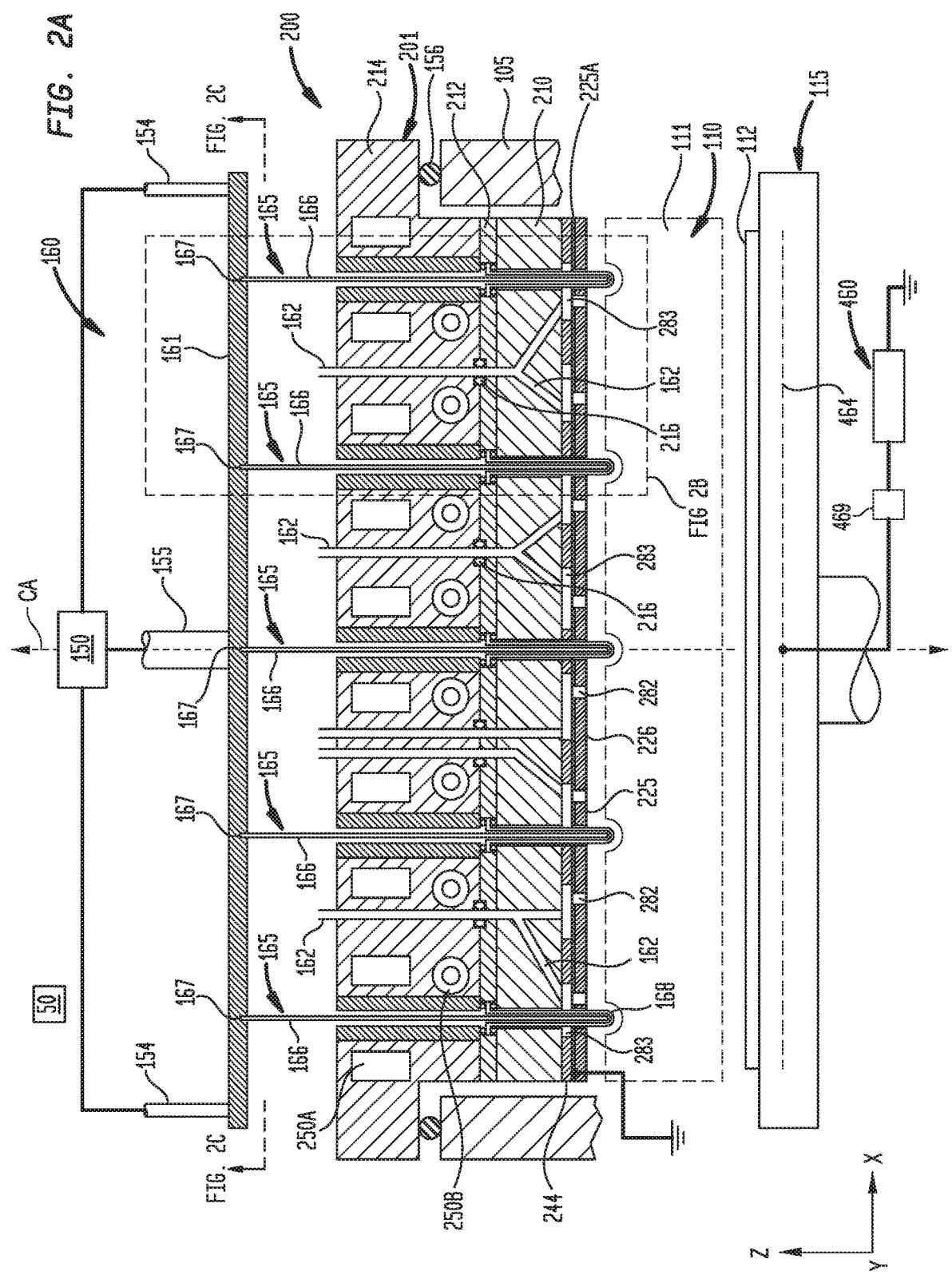

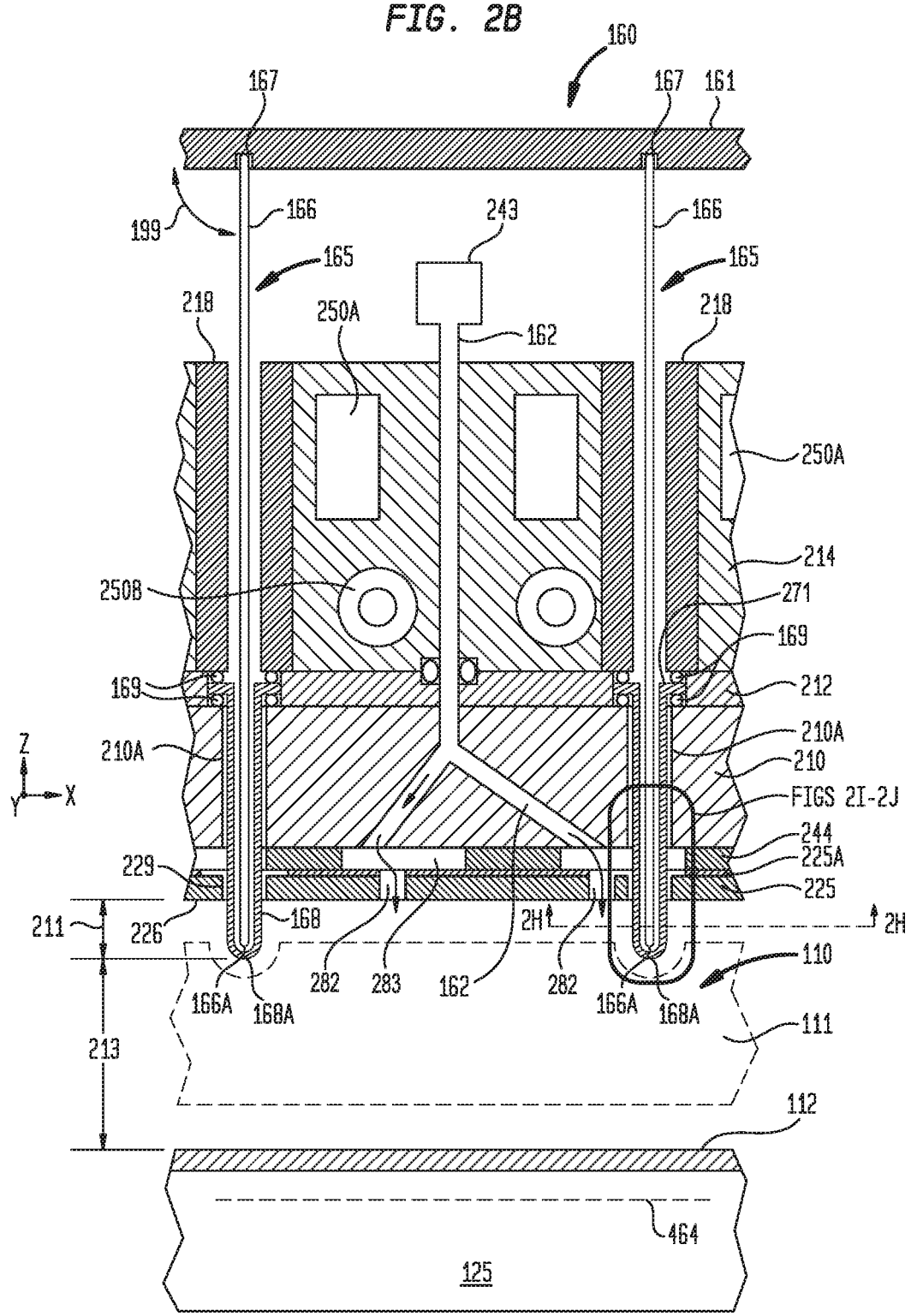

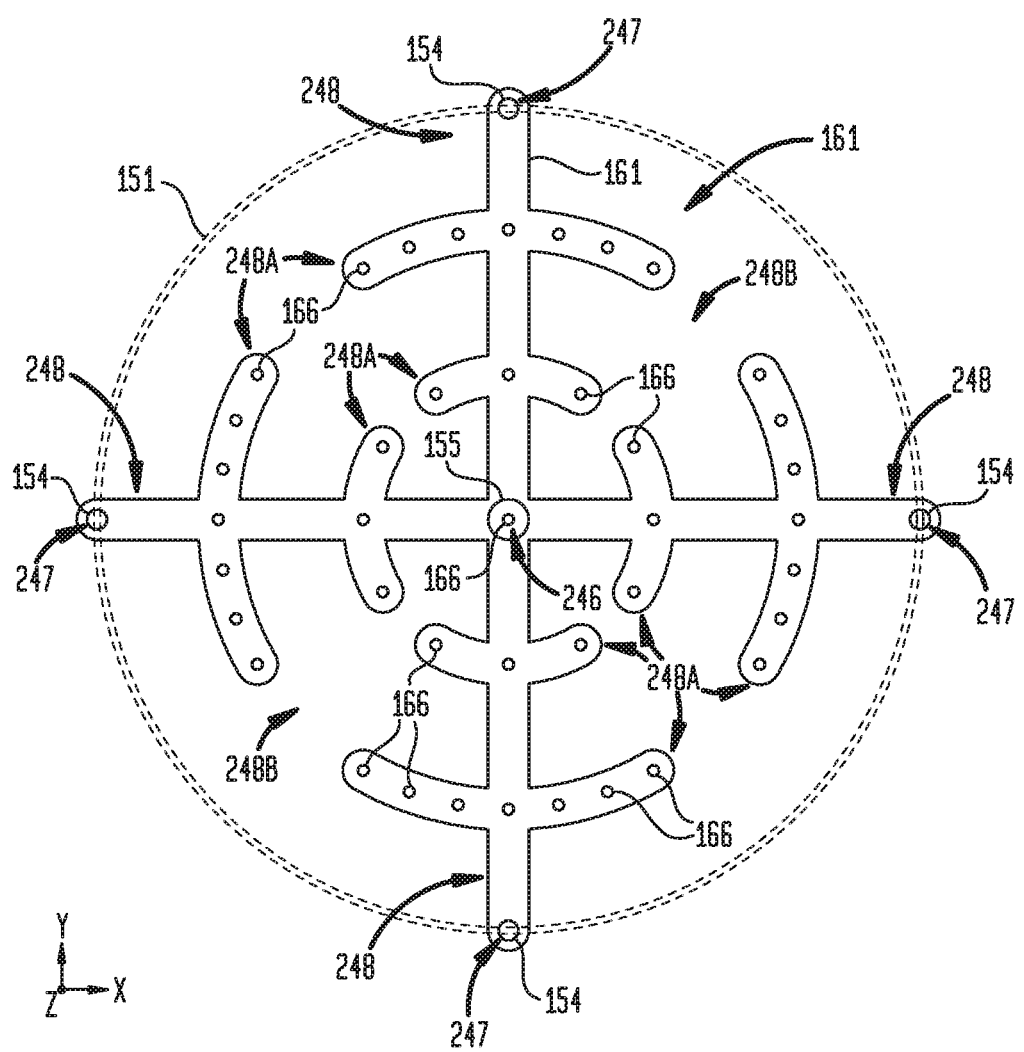
FIG. 2C1

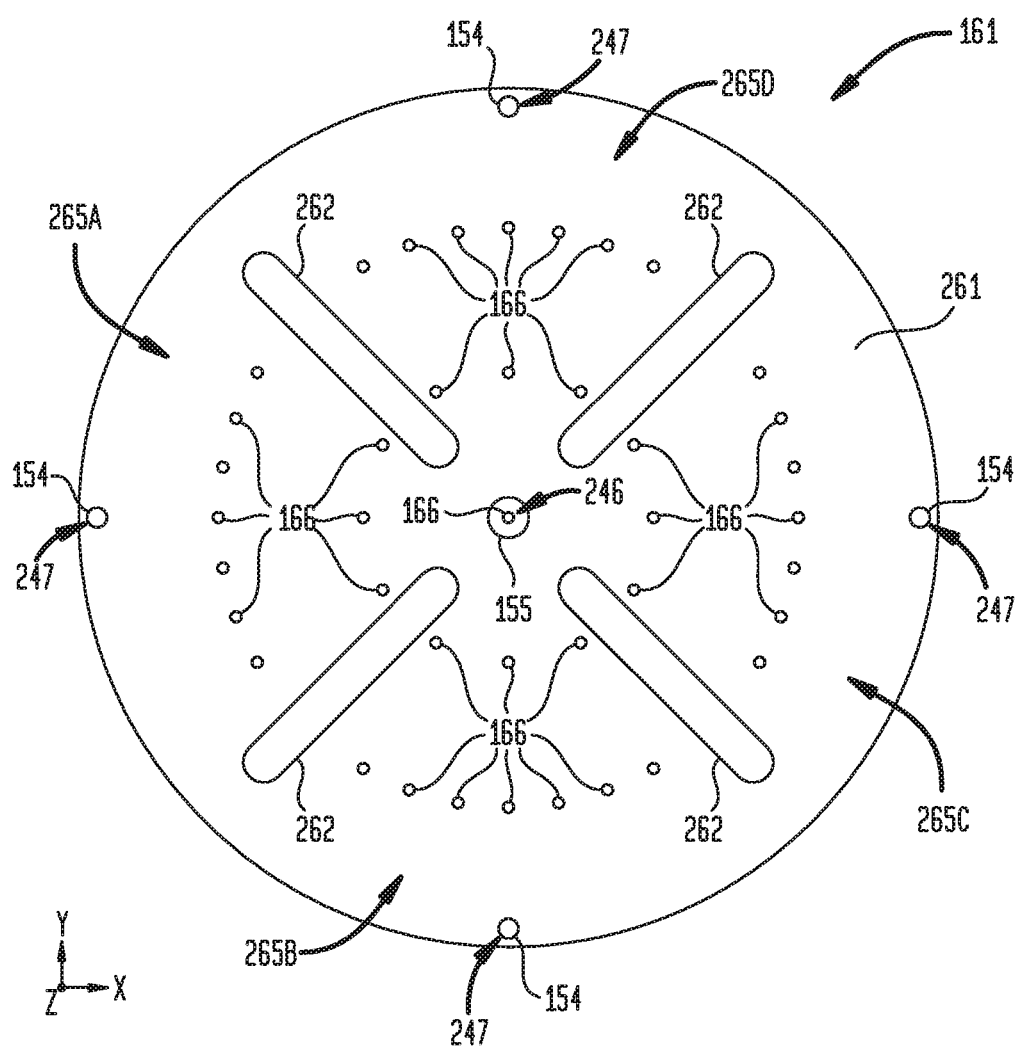

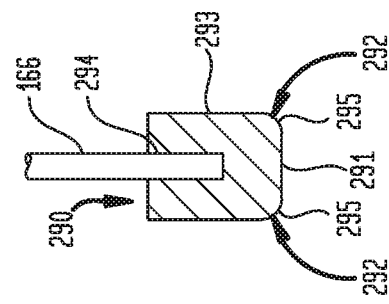
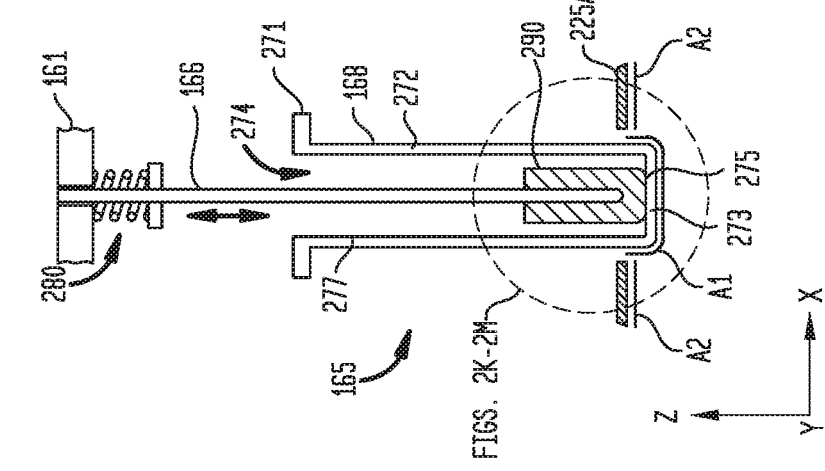
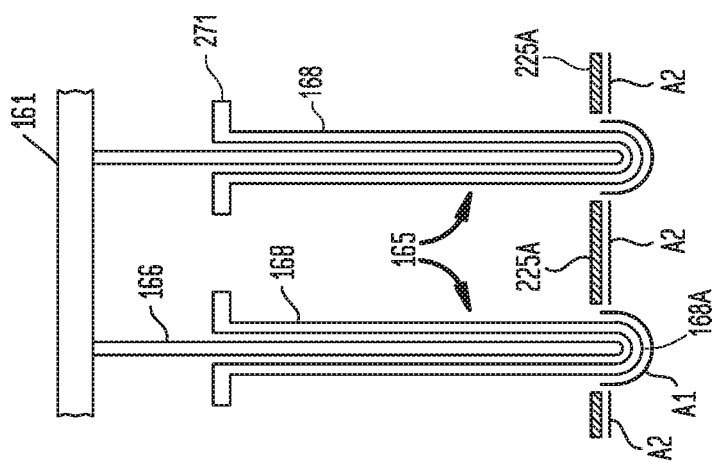

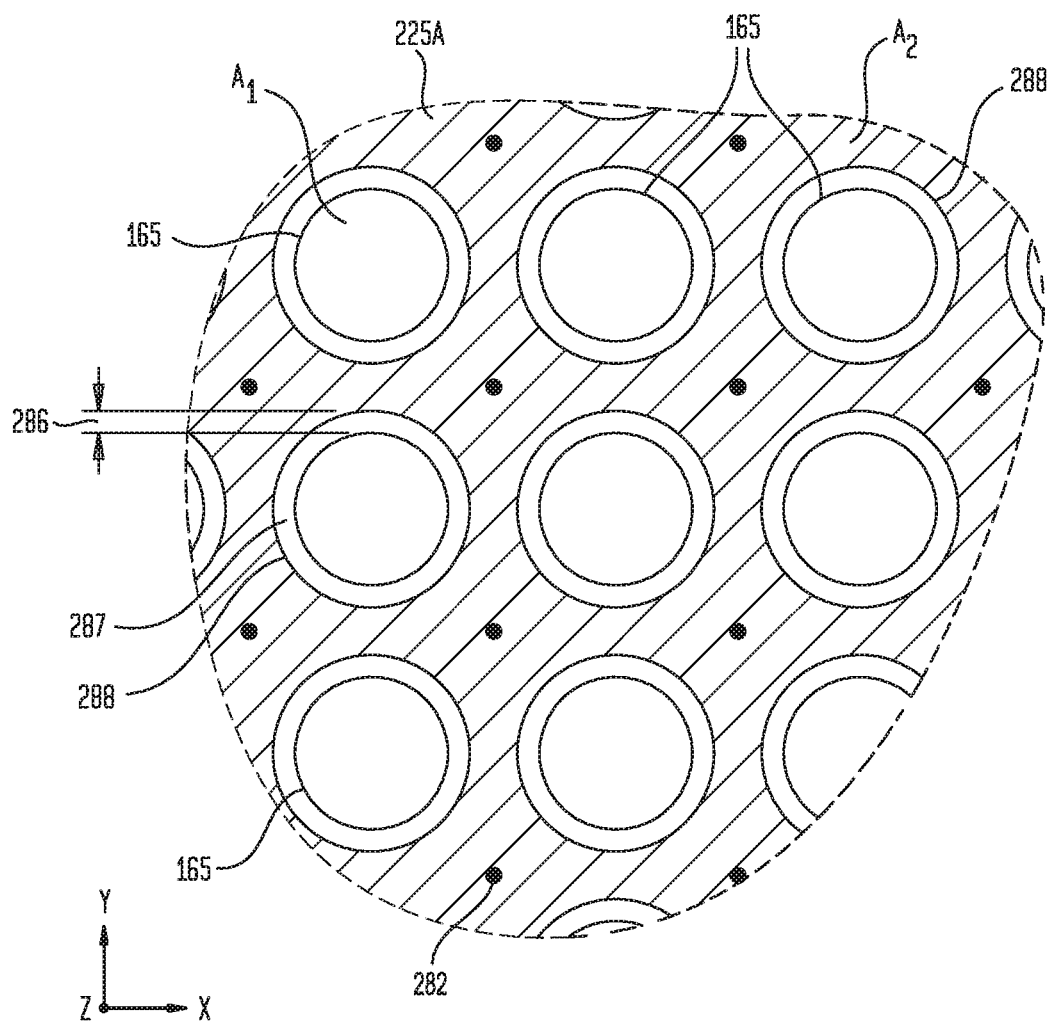

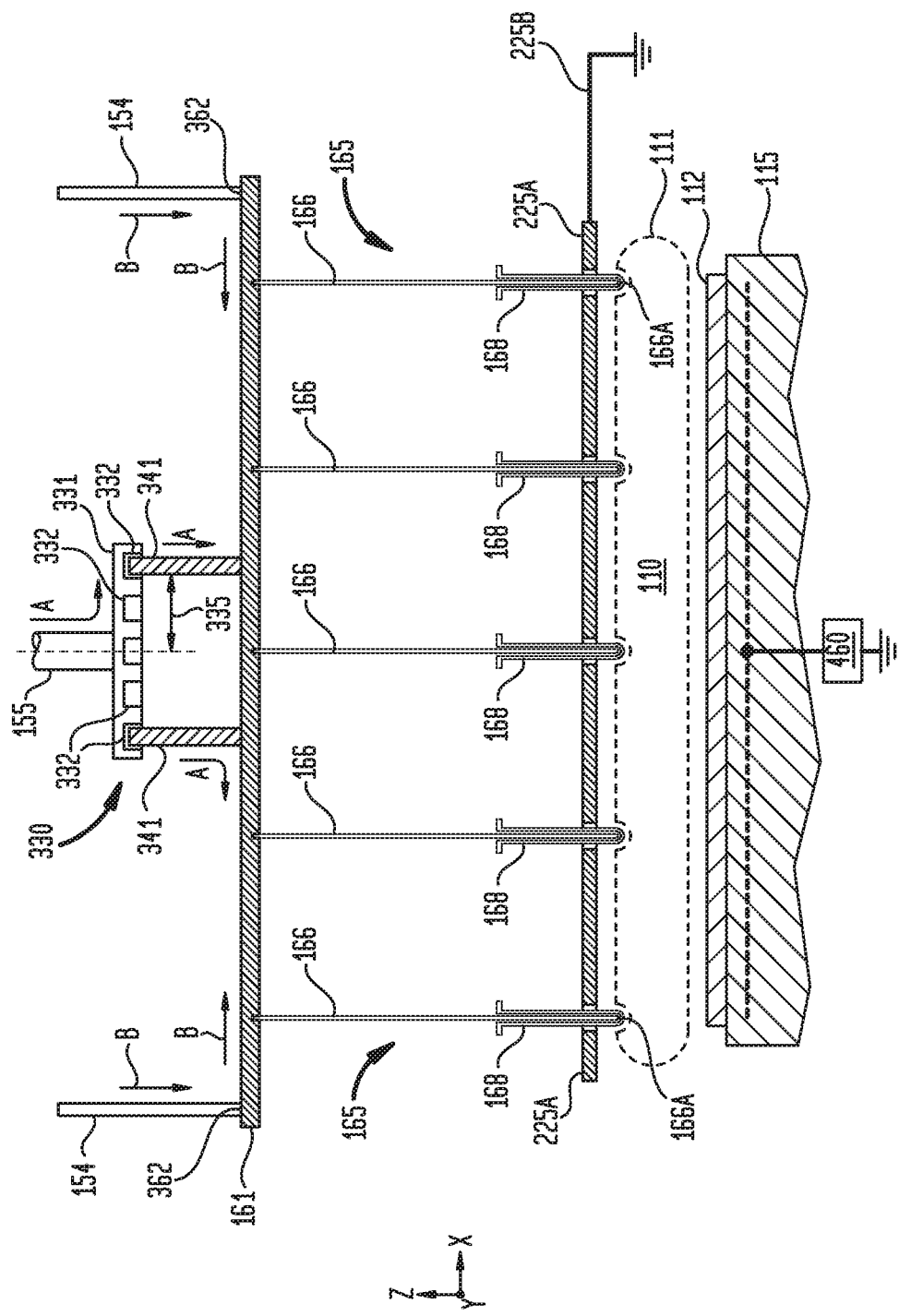

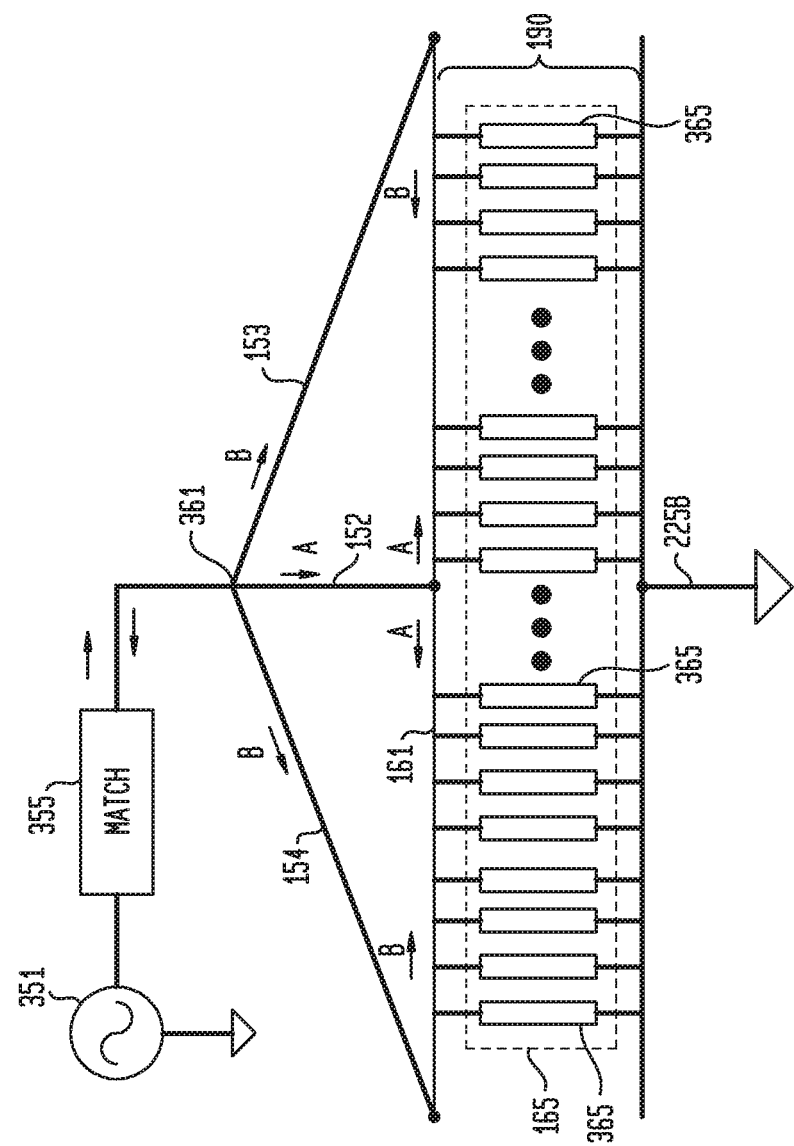

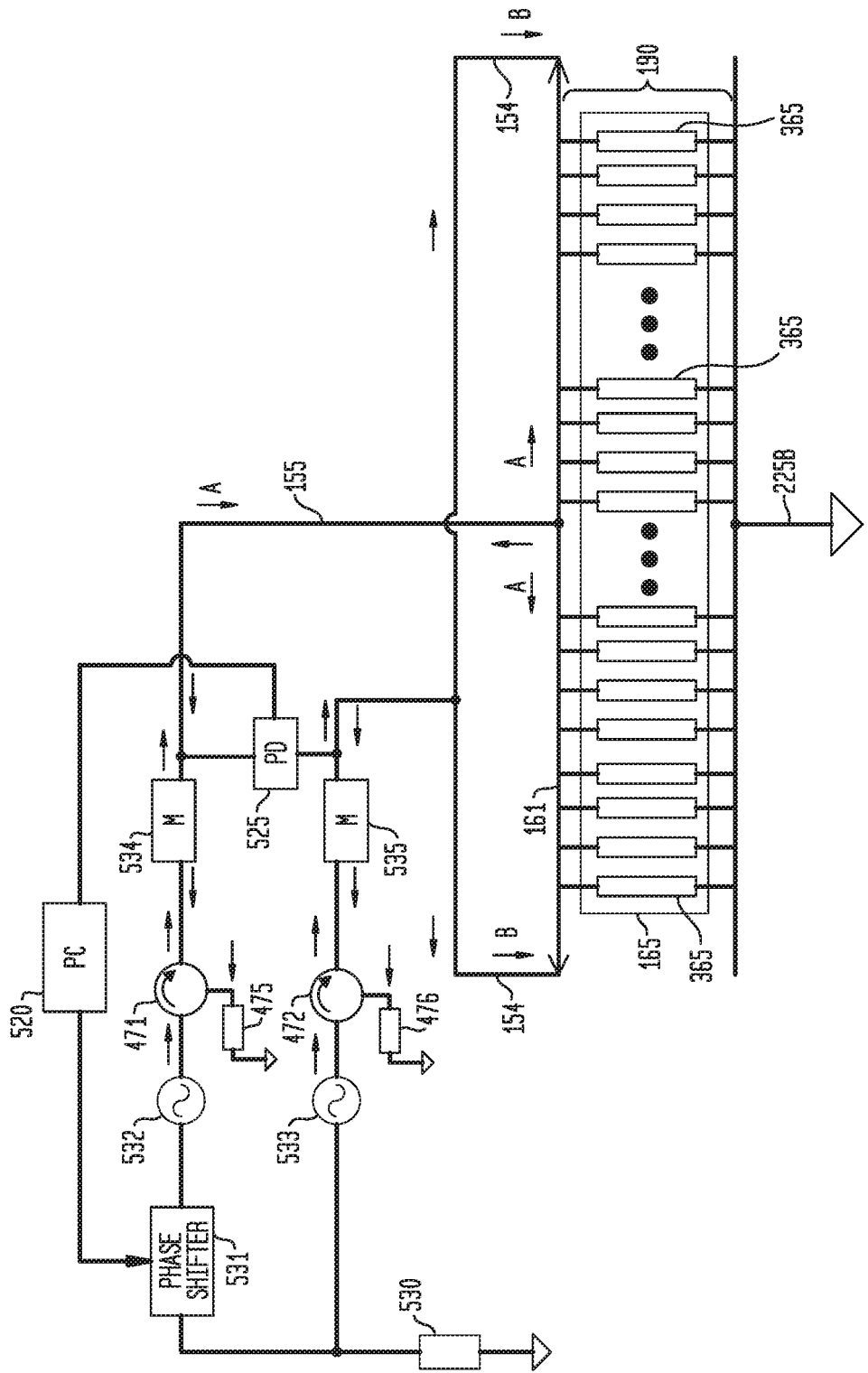

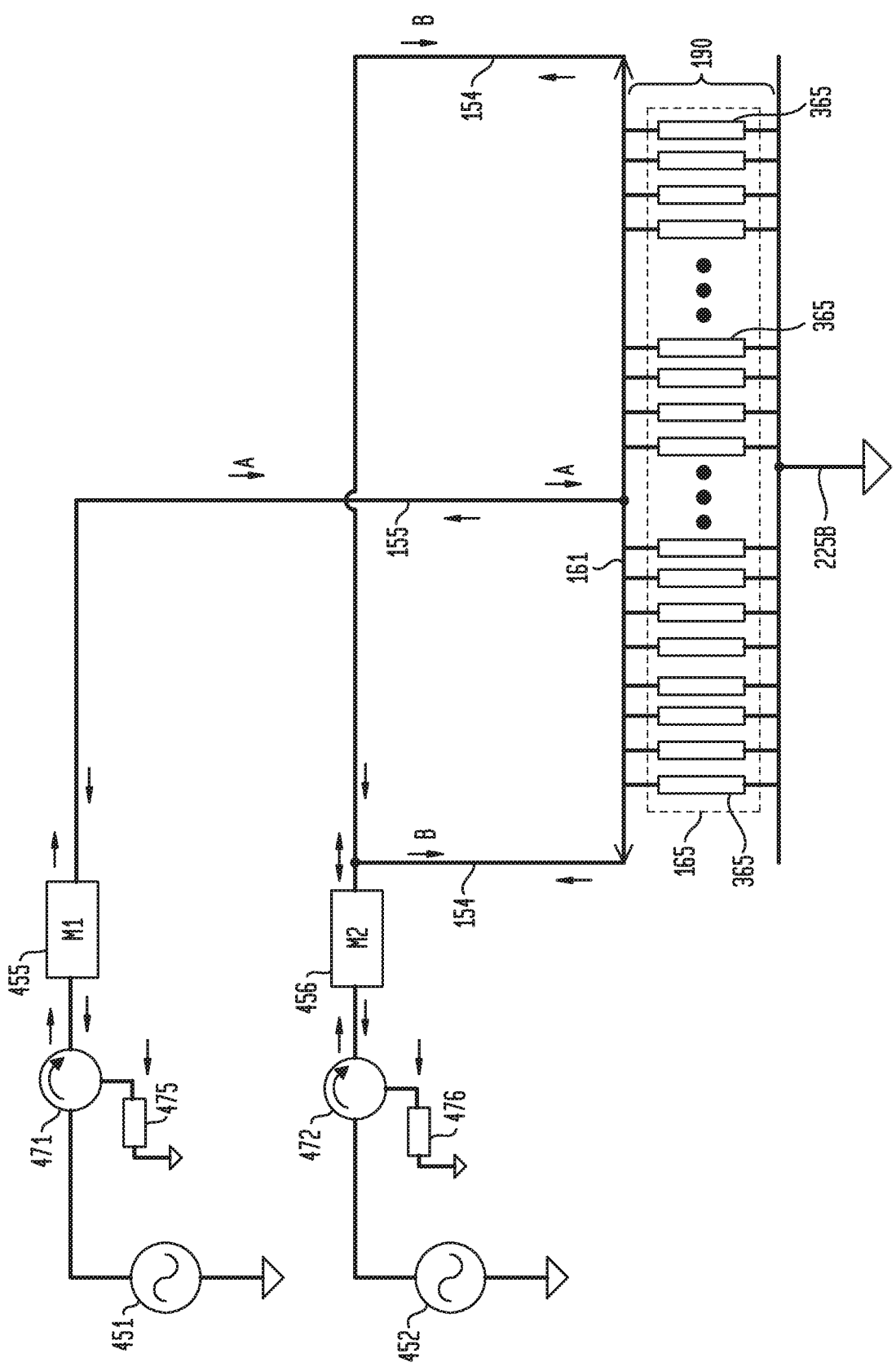

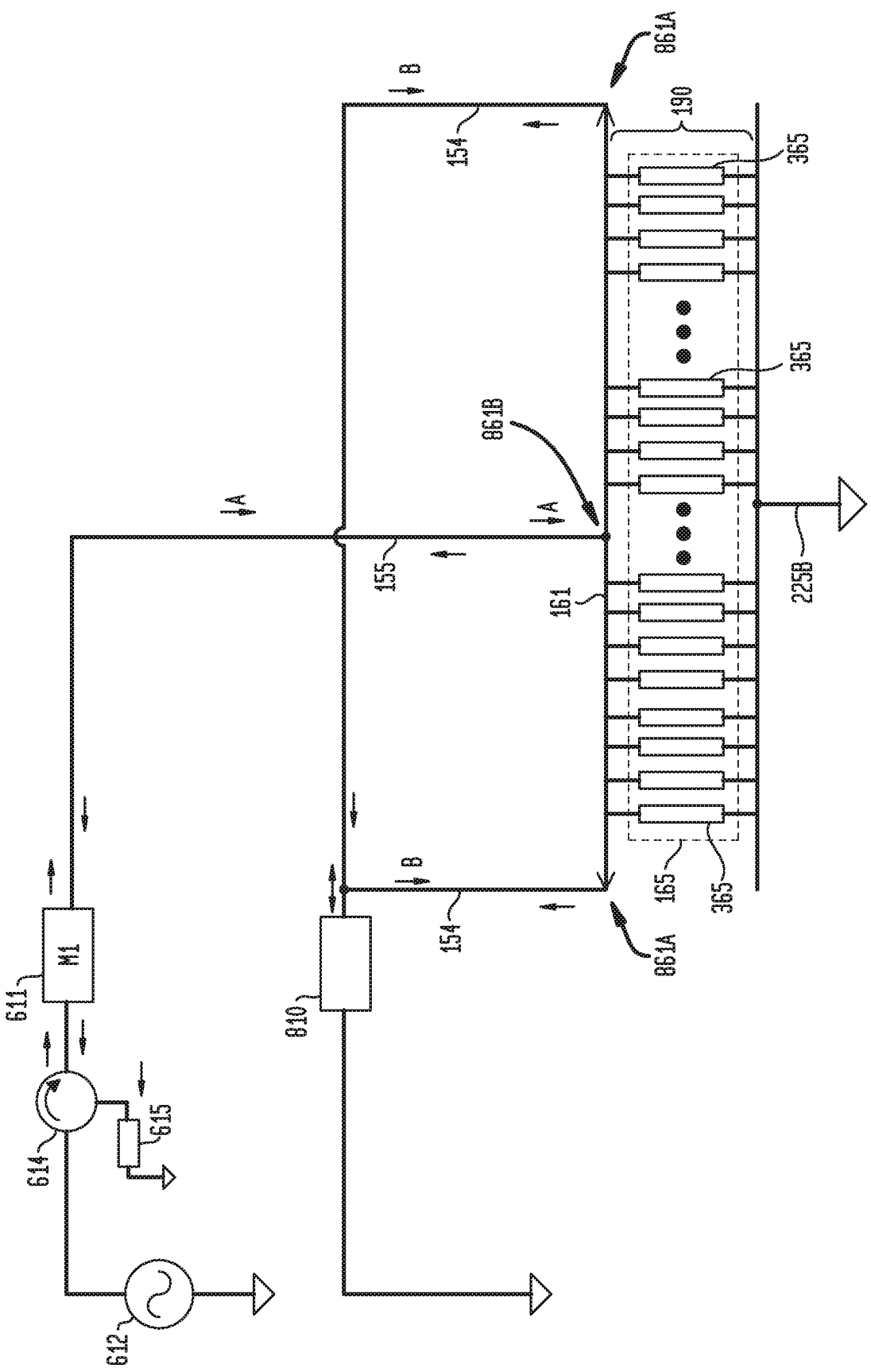

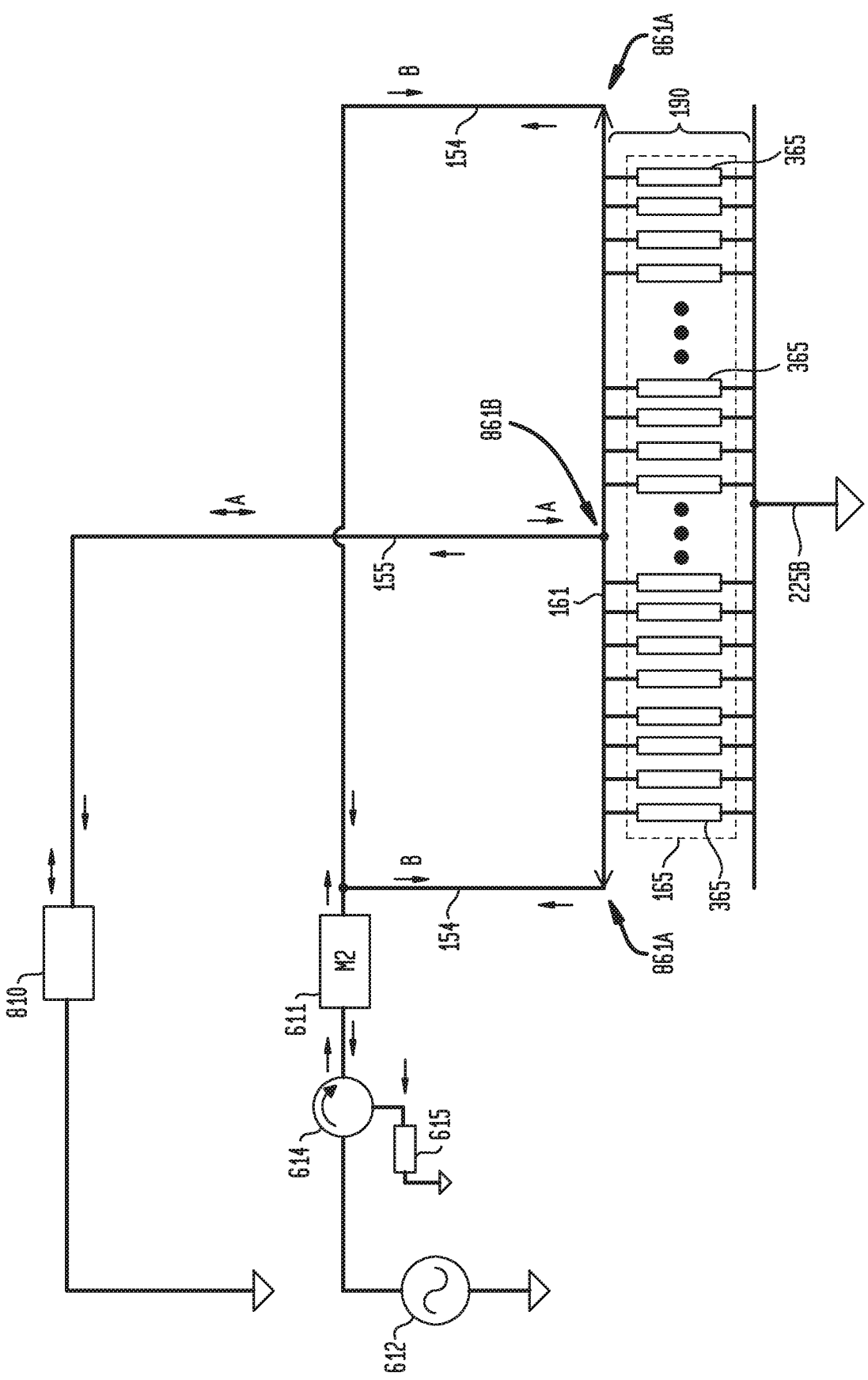

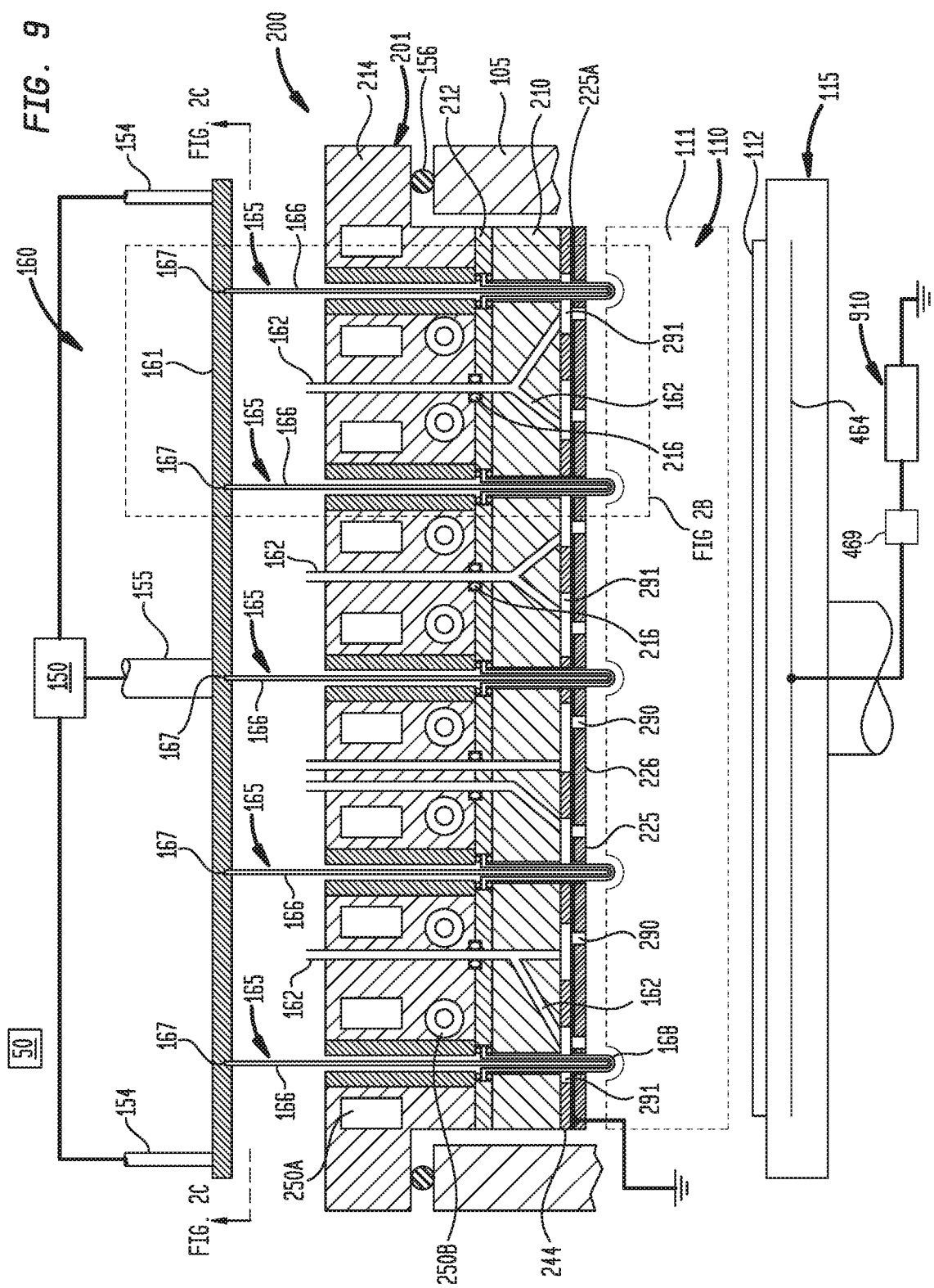

DISTRIBUTED ELECTRODE ARRAY FOR PLASMA PROCESSING

CROSS-REFERENCE TO RELATED APPLICATIONS

This application is a continuation of co-pending U.S. patent application Ser. No. 16/107,855, filed Aug. 21, 2018, which is a continuation of U.S. patent application Ser. No. 16/059,608 filed Aug. 9, 2018, now U.S. Pat. No. 10,312,056, granted on Jun. 4, 2019, which claims benefit of U.S. provisional patent application Ser. No. 62/543,769, filed Aug. 10, 2017, which are all hereby incorporated herein by reference.

BACKGROUND

Field

Embodiments of the present disclosure generally relate to semiconductor processing equipment. More particularly, embodiments of the present disclosure relate to an electrode assembly that is used to generate a plasma to process a substrate.

Description of the Related Art

Integrated circuits have evolved into complex devices that can include millions of components (e.g., transistors, capacitors, resistors, and the like) on a single chip. The evolution of chip designs requires faster circuitry as well as greater circuit density, and the demand for greater circuit density necessitates a reduction in the dimensions of the integrated circuit components. The minimal dimensions of features of such devices are commonly referred to in the art as critical dimensions and generally include the minimal widths of the features of the circuit structure, such as lines, spaces between the lines, columns, openings, and the like.

As these critical dimensions shrink, process uniformity across the substrate becomes important in order to maintain high yields. Conventional plasma processes and conventional chamber designs that are used to manufacture increasing smaller geometry integrated circuits that are required today are not able to meet the deposition or etch rate uniformity requirements needed across the entire substrate during plasma processing which is essential for successful semiconductor device fabrication. Such uniformity is becoming more difficult to achieve as device geometries are shrinking and substrate sizes are increasing. Various sources of process non-uniformity, such as chamber design asymmetries, temperature distribution non-uniformities and gas distribution control are becoming more important. Also, conventional capacitively-coupled plasma sources (CCPs) and inductively-coupled plasma sources (ICPs) suffer from several issues, which include undesirable plasma and process uniformity, and poor process repeatability. For example, conventional inductively coupled plasma sources can have two concentrically arranged coil antennas over the chamber ceiling, so that uniformity of etch rate distribution can be optimized by adjusting the different RF power levels delivered to the different coil antennas. But, as workpiece diameter and chamber diameter increase, we have found this approach is not adequate, as the larger size increases the difficultly of attaining the requisite process uniformity. Also, in both conventional CCP and ICP plasma sources, undesired material sputtering or etching may result in process contamination or particle formation, which may be due to excessive ion energy at the driven or grounded electrode surface or ICP window surface.

In some plasma process chambers or systems, a workpiece is moved through a plasma processing region on, for example, on a linear or rotating workpiece support. In such a chamber, the moving workpiece support circuit may not be a low impedance (relative to plasma impedance) RF ground path, even though it may be DC grounded, through for example, a rotary mercury coupler, brushes or slip rings. The lack of an adequate RF ground path may make it difficult to control ion energy at the workpiece or make repeatability of the plasma process (e.g., deposition or etching process) poor.

Therefore, there is need for a plasma source and/or process chamber that can efficiently produce a uniform plasma that has desirable properties (e.g., degree of dissociation, composition, radical density or flux, ion density, electron density, electron temperature, ion energy distribution, etc), is tunable over the operating window, has a stable and repeatable performance, does not generate particles, and has an acceptable hardware lifetime.

SUMMARY

A plasma source assembly for a process chamber is provided that in one embodiment includes a plurality of discrete electrodes that are positioned relative to a reference electrode, and in some case relative to a gas feed structure, to generate a uniform, stable and repeatable plasma during processing.

Embodiments of the disclosure provided herein include a plasma source assembly, including a reference electrode having an electrode surface that is distributed across a first plane, and an array of discrete electrodes that are arranged in a pattern that is distributed across the first plane. The pattern of discrete electrodes can be formed in an array that is distributed in two non-parallel directions that are both parallel to the first plane. The discrete electrodes can be aligned parallel to a first direction that is oriented at an angle to the first plane, and have an end that is disposed a first distance from the surface in a direction that is substantially perpendicular to the first plane.

Embodiments of the disclosure may further provide a plasma source assembly that includes a power distribution element connected to the plurality of discrete electrodes, wherein the discrete electrodes are arranged in a pattern that is distributed across a surface, and each of the discrete electrodes includes an end that is disposed a first distance from the surface in a direction that is substantially perpendicular to the surface. The plasma source assembly will also include an RF signal generator that provides RF power, and a matching network that receives the RF power from the RF signal generator and provides RF power to at least two connection points on the power distribution element.

Embodiments of the disclosure may further provide a plasma source assembly that includes a power distribution element connected to the plurality of discrete electrodes to provide RF power to the plurality of discrete electrodes, wherein the discrete electrodes are arranged in a pattern that is distributed across a surface, and each of the discrete electrodes includes an end that is disposed a first distance from the surface in a direction that is substantially perpendicular to the surface. The plasma source assembly will also include a first RF generator having an input that receives a first RF control signal and an output that provides RF power to a first connection point on the power distribution element, a second RF generator having an input that receives a second RF control signal and an output that provides RF power to a second connection point on the power distribution element, a phase detector that is configured to detect a difference in the phase of the output from the first RF generator and the output from the second RF generator, and a phase controller that receives the detected phase difference from the phase detector and generates a phase shift control signal that is used to alter the phase of the output delivered from the first RF generator.

Embodiments of the disclosure may further provide a plasma source assembly that includes a power distribution element connected to the plurality of discrete electrodes to provide RF power to the plurality of discrete electrodes, wherein the discrete electrodes are arranged in a pattern that is distributed across a surface, and each of the discrete electrodes includes an end that is disposed a first distance from the surface in a direction that is substantially perpendicular to the surface. The plasma source assembly will also include a first RF generator having an input that receives a first RF control signal and an output that provides RF power to a first connection point on the power distribution element, a second RF generator having an input that receives a second RF control signal and an output that provides RF power to a second connection point on the power distribution element, a phase shifter that provides the first RF control signal to the input of the first RF generator in response to a phase shift control signal and a second RF control signal, a signal generator that provides the second RF signal to the phase shifter and to the input of the second RF generator, a phase detector that is configured to detect a difference in the phase of the output from the first RF generator and the output from the second RF generator, and a phase controller that receives the detected phase difference from the phase detector and provides the phase shift control signal to the phase shifter to alter the phase of the first RF signal.

Embodiments of the disclosure may further provide a plasma source assembly that includes a power distribution element connected to the plurality of discrete electrodes to provide RF power to the plurality of discrete electrodes, wherein the discrete electrodes are arranged in a pattern that extends across a surface, and each of the discrete electrodes includes an end that is disposed a first distance from the surface in a direction that is substantially perpendicular to the surface. The plasma source assembly will also include a first circulator that includes a first, a second and a third port, the second port providing RF power at a first position to the power distribution element via a first matching network, and the third port connected to a first dummy load, a second circulator that includes first, second and third ports, the second port providing RF power at a second position on the power distribution element via a second matching network, and the third port connected to a second dummy load, a first RF generator having that provides RF power to the first port of the first circulator at a first frequency, and a second RF generator having that provides RF power to the first port of the second circulator at a second frequency.

Embodiments of the disclosure may further provide a method of forming a plasma in a processing region of a process chamber that includes delivering RF power to a plurality of discrete electrodes from a first RF generator, wherein delivering RF power from the first RF generator comprises providing RF power to a first connection point on a power distribution element that is coupled to the plurality of discrete electrodes, and each of the plurality of discrete electrodes comprise an end that is disposed a first distance from the surface in a direction that is substantially perpendicular to the surface, delivering RF power to a plurality of discrete electrodes from a second RF generator, wherein delivering RF power from the second RF generator comprises providing RF power to a second connection point on the power distribution element, and controlling a phase of the RF power delivered to the power distribution element from the first RF generator relative to the phase of the RF power delivered to the power distribution element from the second RF generator.

Embodiments of the disclosure may further provide a method of forming a plasma in a processing region of a process chamber that includes delivering a first RF signal to a plurality of discrete electrodes, wherein delivering the first RF signal comprises delivering an RF current or applying an RF voltage to a first connection point on a power distribution element that is coupled to the plurality of discrete electrodes that comprise an end that is disposed a first distance from the surface in a direction that is substantially perpendicular to the surface, delivering a second RF signal to the plurality of discrete electrodes, wherein delivering the second RF signal comprises delivering an RF current or applying an RF voltage to a second connection point on the power distribution element that is coupled to the plurality of discrete electrodes, and selecting a frequency of the first RF signal and a frequency of the second RF signal such that the delivery of first RF signal and the second RF signal to the plurality of discrete electrodes generates a plasma in the processing region, wherein the frequency of the first RF signal is different from the frequency of the second RF signal.

Embodiments of the disclosure may further provide a method of forming a plasma in a processing region of a process chamber that includes delivering a first RF signal to a plurality of discrete electrodes, wherein delivering the first RF signal comprises delivering an RF current or applying an RF voltage to a first connection point on a power distribution element that is coupled to the plurality of discrete electrodes, wherein each of the plurality of discrete electrodes comprise an end that is disposed a first distance from a surface of a reference electrode in a direction that is substantially perpendicular to the surface, and delivering the first RF signal to the plurality of discrete electrodes so that a travelling wave is formed in the power distribution element and a plasma is formed in the processing region.

Embodiments of the disclosure may further provide a plasma source assembly including a reference electrode having an electrode surface, wherein the electrode surface has a central axis that is perpendicular to the electrode surface at a center point. The plasma source will also include an array of discrete electrodes that are arranged in a pattern that is distributed in at least two non-parallel directions that are both parallel to a first plane, which is perpendicular to the central axis, wherein each of the discrete electrodes have a length that is aligned parallel to a first direction that is oriented at an angle greater than zero to the first plane, and each of the discrete electrodes includes an end that is disposed a first distance from the electrode surface, wherein the first distance is measured in a direction that is substantially perpendicular to the first plane. In some embodiments at least a portion of each of the discrete electrodes in the array of discrete electrodes extends through an opening formed through the reference electrode. In some embodiments at least a portion of the reference electrode surrounds each of the discrete electrodes in the array of discrete electrodes. In some embodiments each of the discrete electrodes has an outer surface that has a discrete electrode surface area that comprises an area of the outer surface disposed from the end of the discrete electrodes to the electrode surface, the electrode surface has a reference electrode surface area, and a ratio of the sum of all of the discrete electrode surface areas to the reference electrode surface area is between 0.8 and 1.2. In some embodiments the plasma source assembly further comprises a perforated plate having a plurality of openings formed through a perforated surface of the perforated plate, wherein the plurality of openings are arranged in a pattern that is configured to provide a desired gas flow distribution across the perforated surface when a gas is delivered through the plurality of openings and wherein the electrode surface is substantially parallel to the perforated surface of the perforated plate.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2A is a schematic side cross-sectional view of a portion of the upper chamber assembly illustrated in FIG. 1A, according to an embodiment of the disclosure provided herein.

FIG. 2B is a side cross-sectional view of a portion of the lid assembly illustrated in FIG. 2A, according to an embodiment of the disclosure provided herein.

FIG. 2C1 is a plan view of one configuration of the electrode assembly illustrated in FIG. 2A, according to an embodiment of the disclosure provided herein.

FIG. 2C2 is a plan view of another configuration of the electrode assembly illustrated in FIG. 2A, according to an embodiment of the disclosure provided herein.

FIG. 2I is a schematic side cross-sectional view of a portion of discrete electrodes illustrated in FIG. 2B, according to an embodiment of the disclosure provided herein.

FIG. 2J is a schematic side cross-sectional view of a portion of a discrete electrode illustrated in FIG. 2B, according to an embodiment of the disclosure provided herein.

FIG. 2K is a side cross-sectional view of a portion of a discrete electrode illustrated in FIG. 2J, according to an embodiment of the disclosure provided herein.

FIG. 2N is a bottom view of a portion of a lid assembly of the upper chamber assembly which schematically illustrates a relationship of a reference electrode element and the array of discrete electrodes, according to an embodiment of the disclosure provided herein.

FIG. 3B is a side schematic cross-sectional view of a portion of the lid assembly, according to an embodiment of the disclosure provided herein.

FIG. 4A is a schematic diagram depicting a system for driving the plurality of discrete electrodes, according to an embodiment of the disclosure provided herein.

FIG. 5A is a schematic diagram depicting a system for driving the plurality of discrete electrodes, according to an embodiment of the disclosure provided herein.

FIG. 6A is a schematic diagram depicting a system for driving the plurality of discrete electrodes, according to an embodiment of the disclosure provided herein.

FIG. 8A is a schematic diagram depicting a system for driving the plurality of discrete electrodes, according to an embodiment of the disclosure provided herein.

FIG. 8B is a schematic diagram depicting a system for driving the plurality of discrete electrodes, according to an embodiment of the disclosure provided herein.

FIG. 9 is a schematic side cross-sectional view of a portion of the upper chamber assembly illustrated in FIG. 1A, according to an embodiment of the disclosure provided herein.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the disclosure provide a plasma source assembly and process chamber design that can be used for any number of substrate processing techniques. The plasma source assembly described herein is particularly useful for performing a plasma assisted dry etch process or a plasma assisted deposition process. The plasma source assembly may be utilized in deposition or etch process chambers available from Applied Materials, Inc. of Santa Clara, Calif., but may also be suitable for use in chambers for performing other types of plasma processes as well as chambers available from other manufacturers. In some embodiments of the disclosure provided herein, the plasma source includes a plurality of discrete electrodes that are integrated with a reference electrode and a gas feed structure to generate a uniform, stable and repeatable plasma during processing. As is discussed further below, the plasma source has the ability to control the degree of gas dissociation, active species composition, radical density, radical flux, ion density, ion flux, electron density, electron temperature, ion energy distribution, and other desirable properties within the generated plasma by controlling the way that radio frequency (RF) power is delivered to the discrete electrodes and controlling the gas flow characteristics within the processing region of a process chamber. The plurality of discrete electrodes includes electrodes that can be biased separately, in groups, or all in unison relative to a reference electrode. In some embodiments of the disclosure, as illustrated in FIGS. 1A and 2A-2G, the plurality of discrete electrodes include a plurality of conductive rods that are positioned to generate a plasma within a processing region of a process chamber.

Figure 1A:
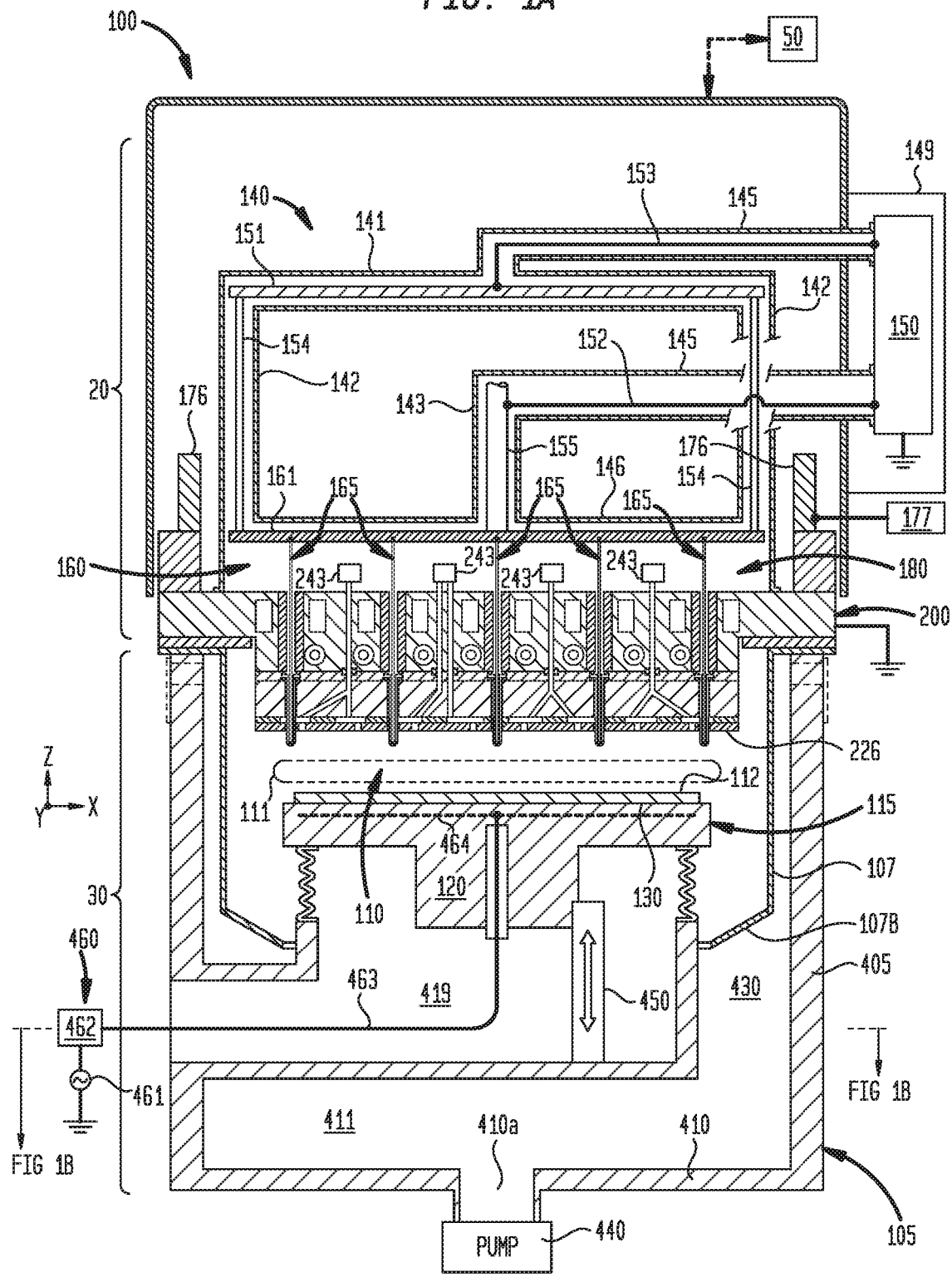
FIG. 1A is a cross-sectional view an illustrative process chamber, according to an embodiment of the disclosure provided herein.
Figure 1B:
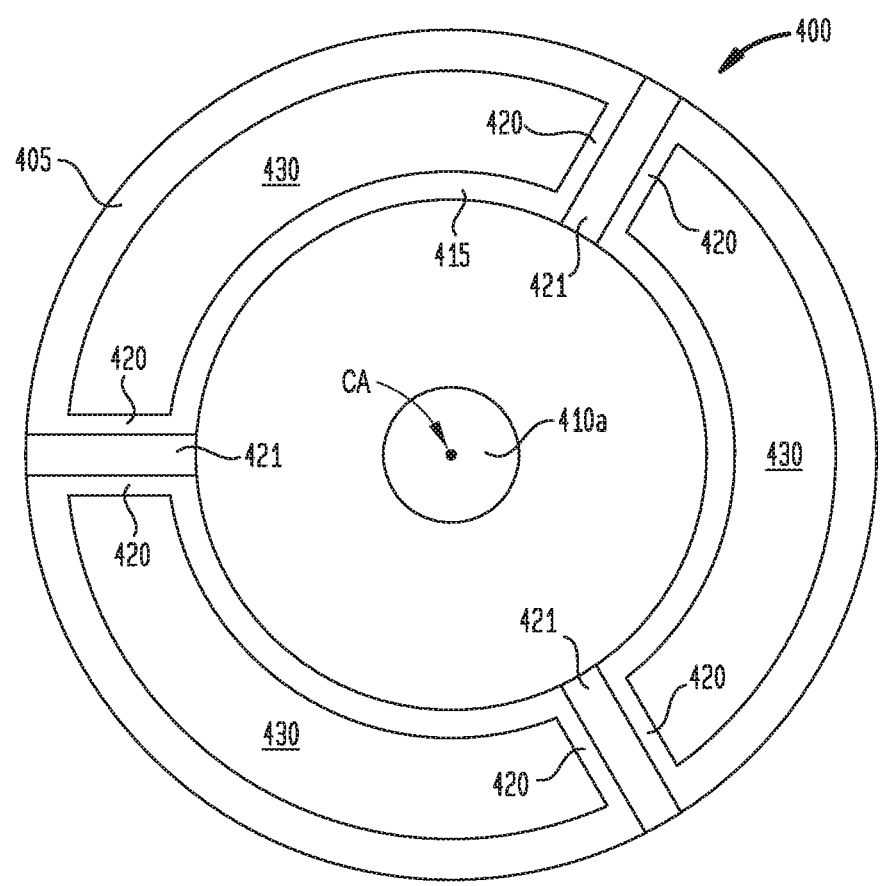
FIG. 1B is a cross-sectional view of a portion of the lower chamber assembly as viewed from the section-line shown in FIG. 1A, according to an embodiment of the disclosure provided herein.

FIG. 1A is a cross-sectional view of a process chamber 100 that includes a plurality of discrete electrodes 165 that are adapted to generate a plasma 111 in a processing region 110 of the process chamber 100. The process chamber 100 generally includes an upper chamber assembly 20, a lower chamber assembly 30 and a system controller 50. The upper chamber assembly 20 generally includes a lid assembly 200, an electrode assembly 160, a fluid source assembly 180 and an RF source assembly 150. As is discussed further below, the lower chamber assembly 30 generally includes a chamber body 105 and a support assembly 115. FIG. 1B is a cross-sectional view of a portion of the lower chamber assembly 30 as viewed from the section-line shown in FIG. 1A.

FIG. 2A is a cross-sectional view of portions of the lid assembly 200 and the electrode assembly 160 according to the disclosure provided herein. The electrode assembly 160 includes a plurality of discrete electrodes 165 that are each coupled to the RF source assembly 150 through one or more power distribution elements 161. The discrete electrodes 165 are typically distributed in a pattern, such as an array formed across a plane (e.g., X-Y plane), that is aligned and/or oriented relative to the surface 226 of the lid assembly 200. In one configuration, where the surface 226 is planar, the discrete electrodes 165 are distributed in a pattern that extends in at least two non-parallel directions that are both parallel to a plane (e.g., X-Y plane) that is aligned parallel to the surface 226. Each of the discrete electrodes 165 typically include a conductive rod 166 that is formed from a metal (e.g., copper, aluminum, nickel, silver, or alloys thereof) or other useful conductive material. The conductive rods 166 in some configurations may be cylindrical in shape, and thus have a diameter and a rod length which extends in a first direction (e.g., Z-direction in FIGS. 2A-2C2). In one example, the diameter of the conductive rods 166 is between about 1 mm and about 15 mm. The conductive rods 166 in some configurations may be bar shaped, and thus have a non-circular cross-section and a rod length which extends in a first direction. The conductive rods 166 are each coupled to a power distribution element 161 at a connection point 167 by use of permanent or non-permanent connection technique, such as by use of a welding or brazing process or by use of a set-screw, reusable electrical connector (e.g., banana plug type) or other desirable coupling technique. The power distribution element 161 includes a conductive structural element (e.g., metal plate) that is adapted to receive the RF power delivered from the RF source assembly 150 through one or more connecting elements 154, 155, and distribute and deliver the received RF energy to each of the conductive rods 166. In some embodiments, the connecting elements 154 are coupled to the RF source assembly 150 through a connecting element 153 and a top power distribution element 151 (e.g., metal plate). In some embodiments, the connecting element 155 is coupled to the RF source assembly 150 through a connecting element 152. FIG. 2C1 is a bottom view of a portion of one configuration of the electrode assembly 160 as seen from the section line shown in FIG. 2A. In one configuration, as shown in FIG. 2C1, a power distribution element 161 disposed within the electrode assembly 160 includes a conductive plate that is coupled to the center connecting element 155 at a center connection point 246 and connected to four connecting elements 154 at four edge connection points 247. The power distribution element 161 includes a plurality of conductive legs 248 that provide a conductive electrical path between one or more of the connecting elements 154, 155 and/or between one or more of the connecting elements 154, 155 and a plurality of the conductive rods 166. In one embodiment, as shown in FIG. 2C1, the power distribution element 161 is configured to electrically connect all of the connecting elements 154, 155 and all of the conductive rods 166 together so that RF power delivered through one or more of the connecting elements 154, 155 can be distributed to each of the conductive rods 166 within the electrode assembly 160.

In some embodiments, each of the conductive legs 248 includes a plurality of branch elements 248A that are configured to physically and electrically connect the conductive rods 166 together and to connect the conductive rods 166 to the conductive legs 248. In some configurations, the branch elements 248A are symmetrically positioned relative to each of the conductive legs 248. In some embodiments, the branch elements 248A that are connected to different conductive legs 248 are electrically isolated from each other by a gap 248B so as to control the path length and electrical coupling between the connecting elements 154 and the connecting element 155 and between each of the connecting elements 154. In some embodiments, gaps 248B formed between adjacent branch elements 248A are all equal in size across the power distribution element 161. While FIG. 2C1 illustrates a power distribution element 161 that is radially symmetric and has four-fold symmetry this configuration is not intended to be limiting as to the scope of the disclosure provided herein since other symmetric or non-symmetric configurations of the power distribution element 161 may be used. In one example, in configurations where the lid assembly 200 is circular in shape, it is believed that power distribution elements 161 that have a six-fold symmetry (i.e., six conductive legs 248 that are coupled to six connecting elements 154 and a center connecting element 155) can have an improved and uniform power distribution over a two-fold or four-fold symmetric configuration of a power distribution element 161. In other examples, power distribution element 161 can have a symmetry that is greater than a two-fold, such as greater than six-fold symmetry. In another example, configurations where the lid assembly 200 is formed in a rectangular shape may require the power distribution element 161 to have symmetry about two different directions (e.g., X and Y-axes). The lid assembly 200 can be formed such that the surface 226 has a rectangular shape, square shape, circular shape, oval shape or other similar shape, when viewed from the bottom side or top side (i.e., viewed from +/−Z-direction). In some configurations, the lid assembly 200 is configured to be symmetric about a central axis CA (FIG. 2A) that passes through a center point that is positioned at the surface 226, or other surfaces formed on or in the lid assembly 200, such as the lower surface of the reference electrode element 225A. In one example, as illustrated in FIG. 2A, the central axis CA is positioned at the center of a circular shaped lid assembly 200, when viewed from the +/−Z-direction, and oriented parallel to the +/−Z-direction and perpendicular to the X-Y plane.

FIG. 2C2 is a bottom view of a portion of an alternate configuration of the electrode assembly 160 as seen from the section line shown in FIG. 2A. In the alternate configuration of the electrode assembly 160, an alternate version of the power distribution element 161 is used in place of the power distribution element 161 illustrated in FIG. 2C1. The alternate version of the power distribution element 161 includes a conductive plate 261 that is coupled to the center connecting element 155 at a center connection point 246 and connected to four connecting elements 154 at four edge connection points 247. The alternate version of the power distribution element 161 is solid plate that includes a plurality of slots 262 formed through the conductive plate 261 (Z-direction) that limit the current flow between regions of the conductive plate 261 and the connecting elements 154, 155 and/or between one or more of the connecting elements 154, 155 and a plurality of the conductive rods 166. The plurality of slots 262 can be oriented in a radial orientation, as shown in FIG. 2C2, and/or in a circular and concentric configuration relative to the center of the conductive plate 261 (not shown in FIG. 2C2) to allow a desired amount of electrical communication between different regions 265A-265D, or sectors, of the conductive plate 261. In one embodiment, the alternate version of the power distribution element 161 is configured to electrically connect all of the connecting elements 154, 155 and all of the conductive rods 166 together so that RF power delivered through one or more of the connecting elements 154, 155 can be distributed to each of the conductive rods 166 within the electrode assembly 160. In some embodiments, the plurality of slots 262 formed through the conductive plate 261 are configured to limit current flow between adjacent regions of the conductive plate during processing.

Referring back to FIG. 1A, in some embodiments, the upper chamber assembly 20 further includes a shielding structure 140 that is configured to prevent the fields generated in the components that deliver RF power from the RF source assembly 150 to the processing region 110 via the conductive rods 166 from affecting the uniform delivery of RF power to the conductive rods 166. The shielding structure 140 is generally an electrically conductive structure (e.g., aluminum) that is adapted to prevent the interaction of fields generated by each of RF power delivery components with fields generated in adjacent RF power delivery components and/or other adjacent grounded or ungrounded process chamber 100 components during processing. The shielding structure 140 includes feed conduits 145 that each separately enclose a connecting element 152, 153, and are coupled to the RF source assembly 150 at one end. The feed conduits 145 are coupled to a ground at the connection point formed between the feed conduits 145 and an interface of the RF source assembly 150. The shielding structure 140 also includes a central feed conduit 141 that encloses the top power distribution element 151 and is coupled to one end of a feed conduit 145 and each distributed feed conduit 142 at the other end. Each of the distributed feed conduits 142 encloses at least a portion of one connecting element 154. An end of each of the distributed feed conduits 142 are coupled to the lid assembly 200, which allows the end of the distributed feed conduits 142 to be grounded. The shielding structure 140 also includes a feed conduit 143 that encloses at least a portion of the connecting element 155. The feed conduit 143 is coupled to one end of a feed conduit 145 and a portion of each of the distributed feed conduits 142 through a lower central feed conduit 146. It is believed that grounding the opposing ends of the shielding structure 140 and separately enclosing each of the RF power delivery components within grounded conduit structures can significantly enhance the uniform delivery of RF power to the processing region 110 through the one or more connecting elements 154, 155 and electrode assembly 160 components during processing.

In some embodiments, the electrode assembly 160 further includes a plurality of electrode shields 168 that are adapted to physically separate the conductive rods 166 from the processing region 110 of the process chamber. As illustrated in FIGS. 2A-2B, an electrode end 166A of each conductive rod 166 is inserted within a space (e.g., blind-hole) formed within an electrode shield 168. Physical separation of the conductive rods 166 from the processing region 110 by the electrode shields 168 can prevent particle contamination of the process chamber and processed substrate(s) due to sputtering of the conductive rod material due to a generated bias when RF power is delivered to the conductive rods 166 during plasma processing. The electrode shields 168 may be formed from a dielectric or semiconducting material, such as sapphire, silicon, silicon carbide, alumina, yttria, zirconia, a silicon oxide ($SiO_x$) containing material, such as quartz or fused silica, or combinations thereof. In an alternate embodiment, each of the conductive rods 166 coated with a dielectric or semiconducting material, such as silicon or silicon dioxide using a silicon containing precursor (e.g., silane) using an in-situ chemical vapor deposition (CVD) process step to form the electrode shields 168 and/or coat the processing region of the process chamber. In either case, at least a portion of the discrete electrodes 165 and electrode shields 168 are disposed within the lid assembly 200 as illustrated in FIG. 2A, and a close-up view illustrated in FIG. 2B.

The lid assembly 200 includes a perforated faceplate 225 and a body 201 which includes a lower plate 210, a support plate 212 and an upper plate 214. The lower plate 210 of the body 201 is coupled to the perforated faceplate 225 by a bond layer 244. The bond layer 244 may be an organic adhesive in some embodiments. The upper plate 214 includes include thermal control conduits 250A and 250B formed therein. The upper plate 214 may be made of a conductive material, such as aluminum, and is coupled to lower plate 210 and support plate 212 by fasteners (not shown) such that a metal-to-metal contact is formed between the lower plate 210, support plate 212 and upper plate 214. In some embodiments, the upper plate 214 includes insulating members 218 (FIG. 2B) that are positioned around at least a portion of each of the conductive rods 166 to reduce and/or minimize the capacitive coupling between the conductive rods 166 and the conductive material of the upper plate 214 during plasma processing. In some embodiments, the lower plate 210, insulating members 218 and/or support plate 212 are formed from a ceramic, semiconductor or dielectric material, such as silicon (Si), silicon carbide (SiC), quartz, alumina ($Al_2O_3$), or aluminum nitride (AlN). The body 201 and the perforated faceplate 225 of the lid assembly 200 can be coupled to the chamber body 105 by fasteners (not shown). A seal 156, such as an elastomeric O-ring, may be disposed between the body 201 and the chamber body 105 to seal the processing region 110 as well as electrically insulate the body 201 from the chamber body 105.

In some embodiments, at least a portion of the electrode shields 168 are disposed within and supported by one or more of the lid assembly 200 components. As shown in FIGS. 2A-2B, the electrode shields 168 are disposed between and sealed to the upper plate 214 and the lower plate 210 by use of two O-rings 169. In this configuration, the electrode shields 168 provide a vacuum to atmospheric pressure interface that physically isolates the conductive rods 166, which are disposed on the atmospheric pressure side of the lid assembly 200, from the vacuum environment maintained in the processing region 110 during processing. The insertion length 211 of the conductive rods 166 and the electrode shields 168 into the processing region 110 can be controlled by selecting a lower plate 210 that has a desired thickness (e.g., thickness in the Z-direction) or by selecting conductive rods 166 and the electrode shields 168 that have a desired physical length. As is discussed further below, the insertion length 211 and/or electrode-to-substrate spacing 213 can be adjusted to alter plasma properties over the surface of the substrate 112 and within the processing region 110. In one embodiment, in which both the conductive rods 166 and electrode shields 168 are used, the insertion length 211 of each of the ends of the electrode shields 168 (e.g., end of the discrete electrodes 165) is between about −10 millimeters (mm) and about +20 mm, where a negative insertion length 211 is created when the electrode end 166A of the conductive rods 166 and shield tip 168A is recessed within the hole in which a conductive rod 166 and electrode shield 168 reside within the lower plate 210 of the lid assembly 200. In one embodiment, the insertion length 211 of the all of the electrode shields 168 is between about 0.1 millimeters (mm) and about 5 mm, such as between about 1 mm and about 2 mm. In another embodiment, the insertion length 211 of the all of the electrode shields 168 in the discrete electrodes 165 is between about −10 mm and about −0.1 mm, such as between about −0.5 mm and about −2 mm. In one embodiment, the insertion length 211 of the all of the electrode shields 168 in the discrete electrodes 165 are all the same length. In some embodiments, the spacing between the outer diameter of the electrode shield 168 and a hole 210A formed within the lower plate 210 is minimized to prevent the possibility of plasma light-up therein, as is discussed further below. In configurations where the electrode shield 168 is not utilized the insertion length 211 is measured from the electrode end 166A to the surface 226.

While the conductive rods 166 and electrode shields 168 of the discrete electrodes 165 are illustrated in FIGS. 2A-202 as being positioned in a perpendicular orientation to the surface 226 of the perforated faceplate 225, this configuration is not intended to be limiting as to scope of the disclosure provided herein since the conductive rods 166 and electrode shields 168 could be oriented at an angle relative to the surface 226 or horizontal plane (e.g., X-Y plane), such as an angle 199 as shown in FIG. 2B. In some configurations, the angle 199 may be between about 45° and about 90°, such as between about 85° and about 90°.

The perforated faceplate 225 includes a plurality of openings 282 that are coupled to a plurality of gas conduits 162 to provide a process gas to the processing region 110. In this embodiment, the gas conduits 162 are formed through the lower plate 210, support plate 212 and upper plate 214 so as to provide the process gas to a distribution channel 283 formed in the bond layer 244 and openings 282 formed in the perforated faceplate 225. The fluid source assembly 180 includes one or more gas sources 243 that are configured to provide one or more process gases to one or more of the gas conduits 162 and the processing region 110. In some embodiments, the process gas(es) provided from the one or more gas sources 243 to the gas conduits 162 is controlled by use of conventional mass flow controllers, valves and other conventional gas delivery equipment that can be controlled by the system controller 50. The process gases may be introduced into the processing region 110 from two or more gas distribution zones formed in the perforated faceplate 225. The two or more gas distribution zones are typically divided radially, and may, for example, be used in combination with two or more of the zones illustrated in FIG. 2E (e.g., three zones 125A, 125B and 125C). In some applications, two or more separated gas distribution networks are formed by use of separate gas conduits 162 when incompatibilities exist between process gases or when mixing in processing region 110 is required. In some embodiments, the one or more gas sources 243 can be controlled so as to provide localized gas distribution control across different regions of the perforated faceplate 225, such as between the center region and the edge region. The localized gas control may include the adjustment of the gas flow ratios of the various process gases, such as polymerizing to non-polymerizing chemistries, oxidizing to non-oxidizing chemistries, differing ratios of deposition precursor gases, and/or inert to reactive chemistry ratios.

The perforated faceplate 225 may be made of a silicon containing material, such as a silicon carbide (SiC) disk or a silicon wafer utilized in electronic device manufacturing processes. In one embodiment, the perforated faceplate 225 may include a silicon carbide (SiC) material that has a silicon dioxide ($SiO_2$), silicon nitride ($Si_3N_4$), silicon (Si), aluminum nitride (AlN) or graphite plate that is positioned thereon, such that the silicon carbide (SiC) material is positioned such that it faces away from the surface 226, or is on a surface that is opposite to the surface 226. In another embodiment, the perforated faceplate 225 may be formed from a material such as sapphire, silicon, alumina, yttria, zirconia, aluminum nitride or silicon oxide (SiOx). The perforated faceplate 225 may be any size and include any suitable surface area. However, in one embodiment, the perforated faceplate 225 is a 450 millimeter (in diameter) silicon wafer. The silicon material of the perforated faceplate 225 may be doped or un-doped to provide enhanced conductive or dielectric properties. The perforated faceplate 225 may optionally include a reference electrode element 225A that includes a conductive layer, a distributed conductive region, conductive sheet or conductive plate that is used as a reference electrode for the RF power delivered to the plurality of discrete electrodes 165. In some embodiments, the reference electrode element 225A includes a metallic layer (e.g., Al, Ni, Cu) that is formed on a surface of the perforated faceplate 225 by use of conventional deposition or doping process. In some embodiments, the reference electrode element 225A includes a doped region of a dielectric or semiconducting material that is formed on a surface of the perforated faceplate 225. In some embodiments, the reference electrode element 225A is disposed on a surface of the perforated faceplate 225 that is not directly exposed to the processing region 110. In one embodiment, the reference electrode element 225A includes a lower surface that is oriented substantially parallel to an adjacently positioned surface of the substrate 112 (e.g., top surface of the substrate). As illustrated in FIG. 2A, the lower surface may extend in directions that are parallel to the X-Y plane and have opposing outside edges that are at least as large as the largest dimension of the substrate 112 (e.g., 300 mm for a 300 mm sized substrate). In one configuration, the lower surface of reference electrode element 225A is planar as illustrated in FIG. 2A, or has a curved shape (e.g., convex shape or concave shape relative to the X-Y plane). However, in configurations where the lid assembly 200 only covers a portion of the substrate surface, such as the "wedge shaped" configuration illustrated in FIG. 7B, the lower surface of the reference electrode element 225A is formed such that reference electrode element 225A has a surface area that is smaller than the surface area of the upper surface of the substrate 112. In this case, the reference electrode element 225A can have a non-circular or circular shape in a plan view. In some configurations as discussed further below in reference to FIG. 7B, the reference electrode element 225A can have a length dimension that is at least as large as the diameter of a substrate 112, but have a lateral dimension in the X-Y plane (e.g., width or angular shaped sector dimension) that is less than the diameter of a substrate 112. In some alternate configurations where the substrate is rotated about the substrate's center during plasma processing, the reference electrode element 225A can be configured to have a length that extends in a radial direction from the center of the round substrate past the outer edge of the substrate and have a circumferential extent in a plan view that is defined by an angle (e.g., acute angle, obtuse angle).

In one embodiment, the reference electrode element 225A is coupled directly to an RF ground at one or more locations. However, in some embodiments, as is further discussed below (see FIG. 3A), the reference electrode element 225A is coupled to an RF ground through an impedance controlling device, such as an RF match. In some embodiments, the RF ground connections made to the reference electrode element 225A are symmetrically disposed about an axis of symmetry or other symmetrical feature. The number of RF ground connections may be at least equal to the number of connecting elements 154 used in the upper chamber assembly 20.

In an alternate configuration of the perforated faceplate 225, the perforated faceplate 225 does not include the reference electrode element 225A and thus electrically floats relative to the applied RF power delivered to the actively biased conductive rods 166. In this configuration, a portion of the conductive rods 166 are directly or selectively connected to a ground, and thus act as reference electrode for the other conductive rods 166 that are actively biased by the RF source assembly 150 components. In one configuration, half of the conductive rods 166 are actively biased by the RF source assembly 150 and the other half are grounded during processing, wherein at least one of the nearest neighbors of an actively biased conductive rod 166 is a grounded conductive rod 166.

The openings 282 formed in the perforated faceplate 225 may be formed using suitable hole forming techniques such as etching or laser drilling. In one embodiment, the openings 282 are formed by a through-silicon-via (TSV) process. In one embodiment, the diameter of each of the openings 282 is about 50 microns (μm) to about 64 μm. In configurations where the openings 282 do not have a circular cross-sectional shape it is desirable to keep the maximum cross-sectional dimension of the opening to a size less than about 50 microns (μm) to about 64 μm. The openings 282 may be numerous in relation to the surface area of the perforated faceplate 225 (i.e., dense) to maximize flow conductance and/or minimize pressure in the distribution channels 283. As illustrated in FIGS. 2A-2B, the openings 282 are positioned in an array or pattern across the surface 226 of the perforated plate 225. The array or pattern is typically configured to interleave with the discrete electrodes 165 and to provide a desirable gas flow pattern across the surface 226 of the perforated faceplate 225, and thus within the processing region 110. One or more of the sizes of the openings 282 and the density of the openings 282 are adjusted to reduce the possibility of plasma light-up in the distribution channels 283 or other portions of the body 201. The need to suppress plasma light-up in the openings 282, distribution channels 283 or other portions of the body 201 is increasingly important in configurations where the reference electrode element 225A is positioned in close proximity to the discrete electrodes 165. Utilizing a silicon wafer for the perforated faceplate 225 provides a replaceable consumable element of the lid assembly 200. For example, as plasma may erode surfaces of the perforated faceplate 225 over time. When eroded, the perforated faceplate 225 may be decoupled from the lower plate 210 and a new perforated faceplate 225 may be bonded thereto.

Figure 2D:
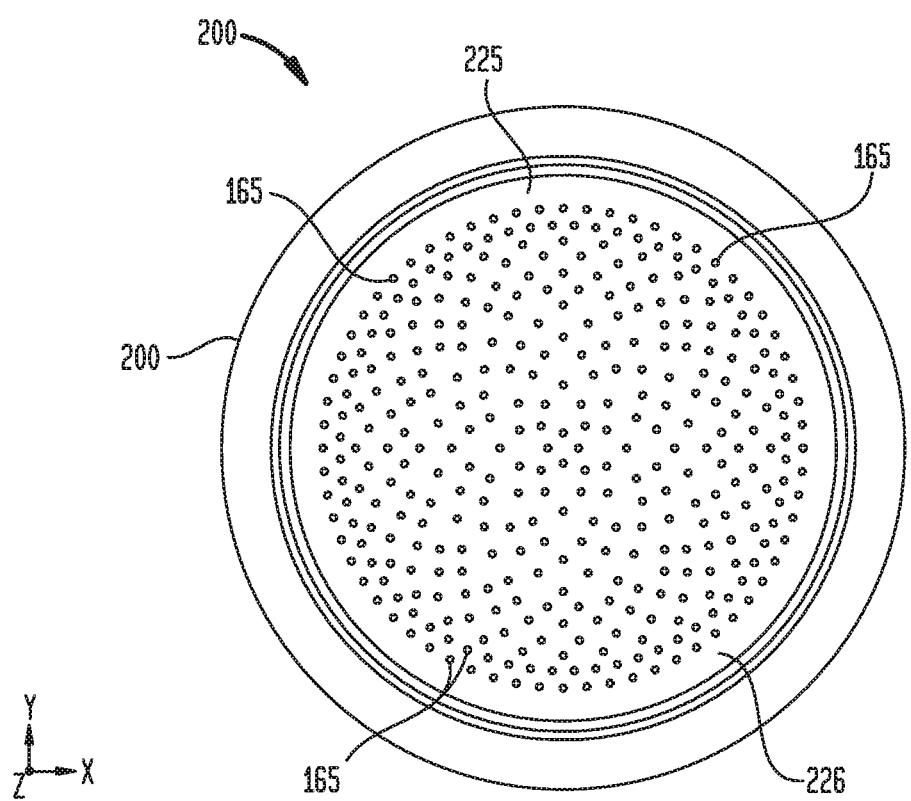
FIG. 2D is a bottom view of a portion of a lid assembly of the upper chamber assembly, according to an embodiment of the disclosure provided herein.
Figure 2E:
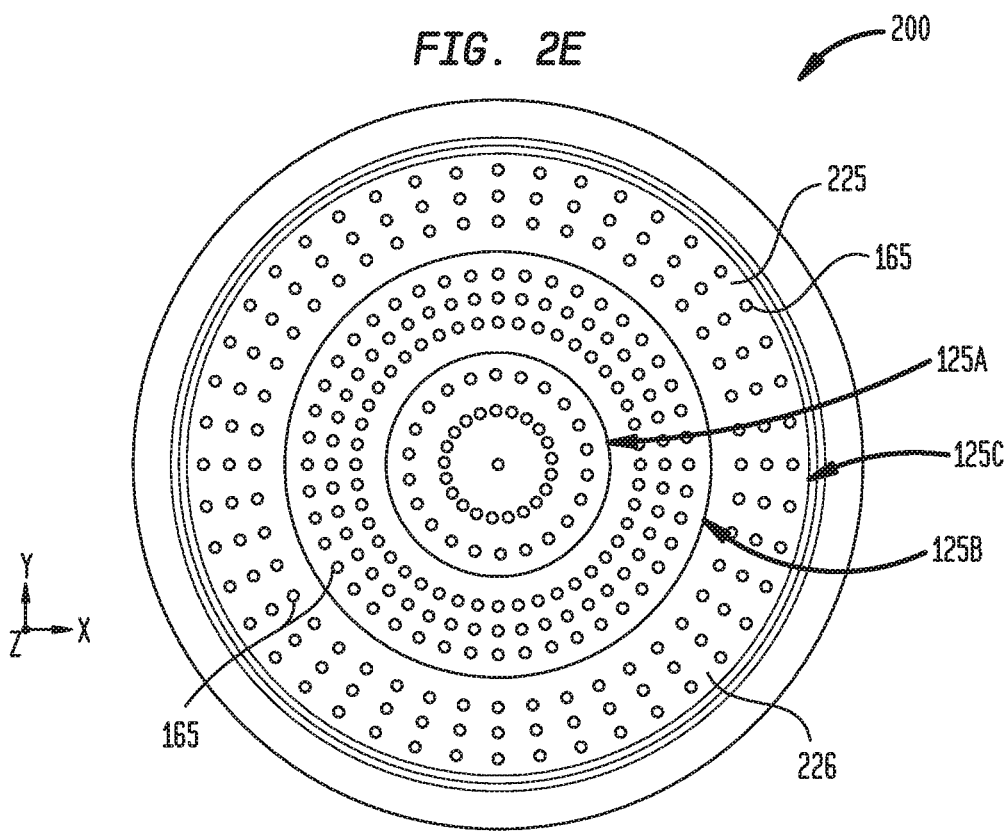
FIG. 2E is a bottom view of a portion of a differently configured lid assembly of the upper chamber assembly, according to an embodiment of the disclosure provided herein.
Figure 2F:
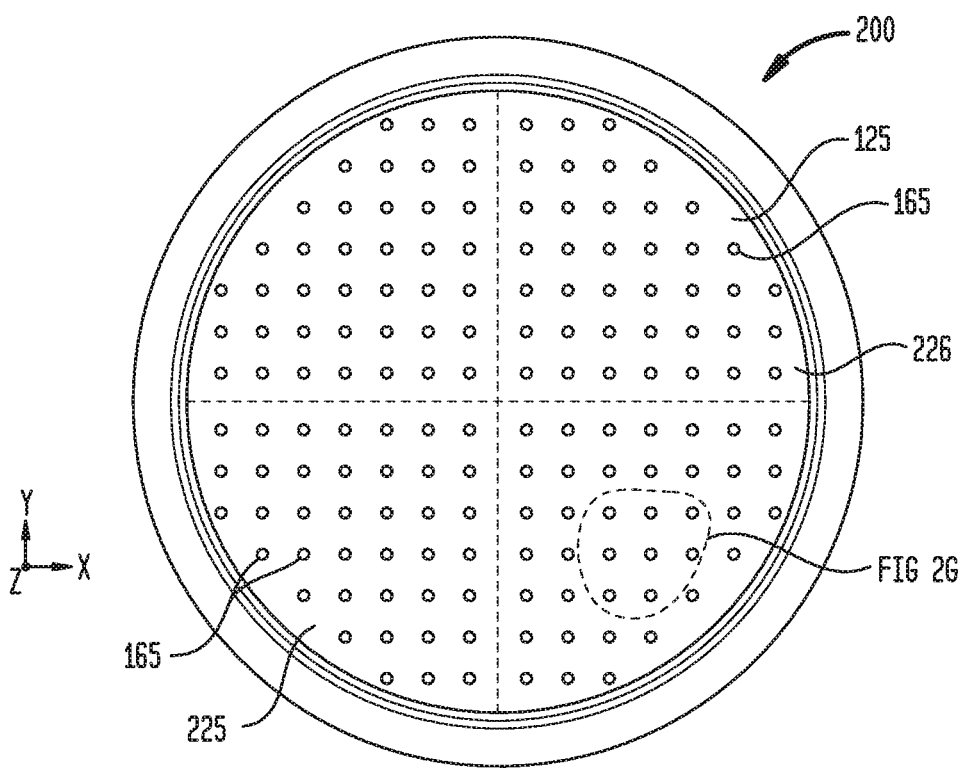
FIG. 2F is another bottom view of a portion of a differently configured lid assembly of the upper chamber assembly, according to an embodiment of the disclosure provided herein.

FIGS. 2D-2F are bottom views of the lid assembly 200 that illustrate differing patterns of discrete electrodes 165 which can be used to generate a plasma having desirable plasma properties during a plasma processing. It is noted that the openings 282 have been omitted from the surface of the perforated faceplates 225 illustrated in FIGS. 2D-2F for clarity of discussion purposes. FIG. 2D illustrates a lid assembly 200 configuration that has a non-uniform radial distribution of discrete electrodes 165 across the surface 226 of the perforated faceplate 225. FIG. 2E illustrates a lid assembly 200 configuration that has three zones 125A, 125B and 125C that each have a differing radial distribution of discrete electrodes 165 formed therein. In some configurations, each of the discrete electrodes 165 in each of the different zones can be separately biased to provide a different plasma density therein. In one example, each of the discrete electrodes 165 in the first zone 125A are coupled to a first power distribution element, each of the discrete electrodes 165 in the second zone 125B are coupled to a second power distribution element and each of the discrete electrodes 165 in the third zone 125C are coupled to a third power distribution element, wherein each of the first, second and third power distribution elements can be biased in unison or separately by the components found in the RF source assembly 150. FIG. 2F illustrates a lid assembly 200 configuration that has a uniform distribution of discrete electrodes 165 across the X-Y plane and the surface 226 of the perforated faceplate 225. The various configurations of discrete electrodes 165 shown in FIGS. 2D-2F are intended to illustrate just a few examples of arrays of discrete electrodes 165 that are distributed in a pattern that is aligned parallel to a plane (i.e., X-Y plane). As shown, the illustrated patterns include arrays of discrete electrodes 165 that are distributed in at least two non-parallel directions (e.g., X and Y directions).

Figure 2G:
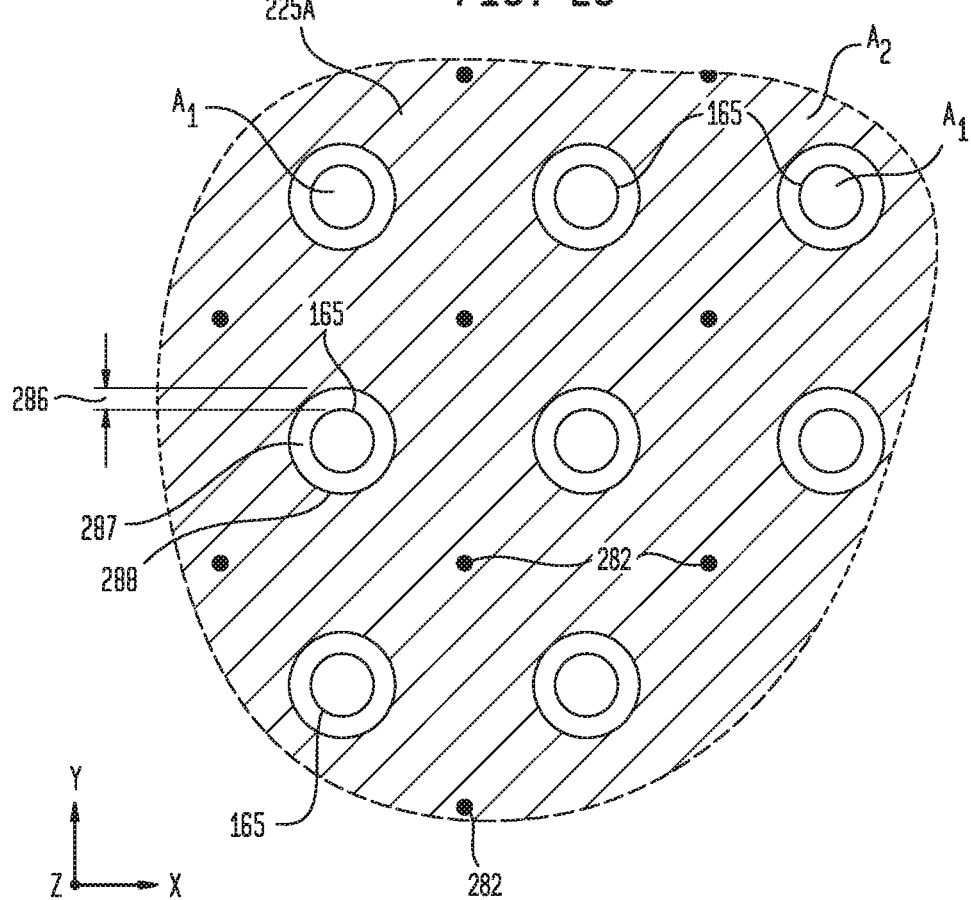
FIG. 2G is a bottom view of a portion of a lid assembly of the upper chamber assembly which schematically illustrates a relationship of a reference electrode element and the array of discrete electrodes, according to an embodiment of the disclosure provided herein.

FIG. 2G is a bottom view of a portion of a lid assembly 200 that schematically illustrates a pattern of discrete electrodes 165, an interspersed pattern of gas delivery openings 282 and a portion of a reference electrode element 225A. The portion of the reference electrode element 225A illustrated in FIG. 2G is shown without any intervening materials (e.g., non-conductive part of the perforated faceplate 225) for ease and clarity of discussion.

Figure 2H:
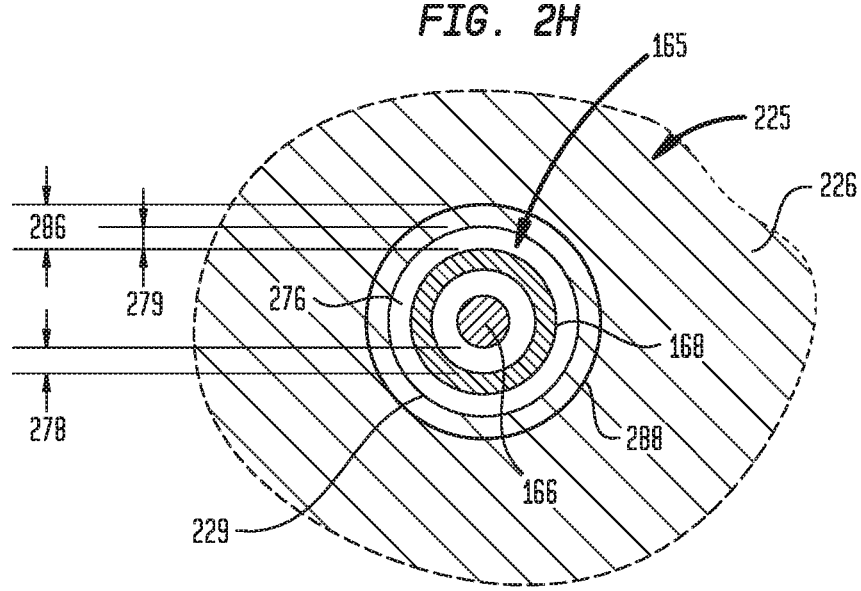
FIG. 2H is a bottom view of a portion of a lid assembly that includes a partial section view of a discrete electrode, according to an embodiment of the disclosure provided herein.

FIG. 2H is a bottom view of a portion of a lid assembly 200 that includes a partial section view of a discrete electrode 165 and a bottom view of faceplate 225. As illustrated in FIG. 2H, the discrete electrode 165 is disposed through a portion of faceplate 225, and includes a conductive rod 166 and an electrode shield 168, as discussed above. In some embodiments, a shield gap 278 is formed between the conductive rod 166 and the electrode shield 168. It is generally desirable to minimize the size of the shield gap 278 to improve the capacitive coupling of the conductive rods 166 to the processing region 110 during processing. However, in some configurations the shield gap 278 may be designed to be between 0.01 mm and 1 mm. Additionally, a vacuum gap 276 is formed between the surface of a discrete electrode 165 and an adjacent surface of the perforated faceplate 225 and lower plate 210. The vacuum gap 276 is a non-material containing region (e.g., vacuum containing region) that is formed between the outer edge of each discrete electrode 165 (e.g., outer surface of the electrode shield 168) and the adjacently positioned surface(s) of the perforated faceplate 225 and lower plate 210. In one example, the adjacent surfaces can include a through hole that has an inner edge 229 that is spaced a distance 279 equal to the vacuum gap 276 from the outer surface of the discrete electrodes 165. The vacuum gap 276 is generally sized so that a plasma will not be formed in the space formed therebetween during processing, and may be between 0.1 mm and 1 mm in size, such as between about 0.1 and about 0.25 mm.

As illustrated in FIG. 2G, the discrete electrodes 165 are disposed in desired pattern across the X-Y plane that is, for example, parallel to surface 226 of the lid assembly 200. The reference electrode element 225A (i.e., cross-hatched region) is also disposed around and in-between each of the discrete electrodes 165 arranged in the desired pattern to provide a symmetric and reliable ground path for the RF power provided to each of the discrete electrodes 165 by the RF source assembly 150. As shown in FIGS. 2G and 2H, at least a portion of the reference electrode element 225A surrounds each of the discrete electrodes 165. The total area associated with the exposed tip surface area of each discrete electrode 165 exposed to the processing region can be defined as the electrode surface area A1 and the cross-hatched region of the reference electrode element 225A can be defined as the total reference electrode surface area A2. A symmetric and reliable ground path with a determined ratio between the discrete electrode surface area A1 and reference electrode surface area A2 can be important for controlling plasma uniformity, plasma density or plasma ion energy when used in process chamber configurations that have a symmetrically configured processing region 110 and also used in process chamber configurations that have non-symmetrically configured processing region 110 defining components (e.g., chamber liner 107) and/or chamber walls.

An electrode gap 287 is formed between each discrete electrode 165 and the reference electrode element 225A. The electrode gap 287 is defined by the distance 286 formed between an edge 288 of the reference electrode element 225A and a portion of a discrete electrode 165. The space, or distance 286, is defined by the smallest distance created between a portion of a discrete electrode 165 and the edge 288 of the reference electrode element 225A. In some configurations, an intervening semiconducting and/or dielectric material and vacuum containing region (e.g., vacuum gap 276) may be disposed within the electrode gap 287. Referring to FIGS. 2G and 2H, in some embodiments in which an electrode shield 168 is utilized, the electrode gap 287 is formed between an outside edge of the electrode shield 168 of the discrete electrode 165 and the edge 288, or the electrode gap 287 may be formed from the shield tip 168A (FIG. 2B) of the electrode shield 168 and the edge 288, depending on the insertion length 211 of the discrete electrodes 165 within the lid assembly 200. As shown in FIG. 2H, the electrode gap 287 has a distance 286 formed between the outside edge of the electrode shield 168 and the edge 288 that is different from the distance 279 of the vacuum gap 276 formed between the edge 299 of the faceplate 225 and the electrode shield 168. In an alternate configuration, the distance 286 of the electrode gap 287 may be the same as the distance 279 of the vacuum gap 276 between the discrete electrode 165 and the edge 299 of the faceplate 225 (not shown). In some embodiments, the distance 286 is between about 0.5 mm and about 10 mm, such as between about 1 mm and about 5 mm. In one example, the distance 286 provided by the electrode gap 287 is set at about 3 mm when a plasma process is performed in the process chamber is commonly run at pressures near 10 Torr, and is set at about 10 mm when the plasma process is commonly run at pressures near 1 Torr. While the pattern of discrete electrodes 165 and interspersed pattern of gas delivery openings 282 are illustrated in FIG. 2G in a square or a rectangular pattern this configuration is not intended to be limiting as to the scope of the disclosure provided herein since any other desirable pattern of discrete electrodes 165 and/or openings 282 may be used (e.g., radial pattern or hexagonal pattern).

FIG. 2I is a schematic side cross-sectional view of a portion of the discrete electrodes 165 illustrated in FIG. 2B with portions of lid assembly 200 removed for clarity. As illustrated in FIG. 2I, the discrete electrodes 165 each include a conductive rod 166 that is attached to the power distribution element 161. The conductive rod 166 is inserted into electrode shield 168 which surrounds a lower portion of conductive rod 166 and is designed to physically separate the conductive rod 166 from the processing region 110 (FIGS. 1A and 2A) of a process chamber 100. The conductive rod 166 and the electrode shield 168 are positioned through openings in the reference electrode element 225A so that portions of the conductive rod and/or electrode shields are in a position to influence a plasma formed in the processing region 110. As shown in FIG. 2I, the outer surface portion of the electrode shield tip 168A that is exposed to the processing region of the processing chamber and is below the reference electrode element 225A has a surface area A1 and the reference electrode element 225A has a surface area of A2 which faces the processing region. It has been found that the ratio of the sum of the surface areas A1 of the discrete electrodes 165 to the reference electrode element surface area A2 can influence the plasma density, plasma uniformity or plasma ion energy during processing. In operation, there are a number of ways to change the ratio between areas A1 and A2. In one example, the area A1 can be controlled by determining the insertion length 211 (FIG. 2B) of the portion of the discrete electrode that is positioned through the hole in the reference electrode element 225A and exposed to the processing region. The greater the portion of each of the discrete electrodes 165 that are exposed to the processing region, the greater the area A1 relative to A2. Controlling the insertion length 211 (FIG. 2B)

of each of the discrete electrodes 165 exposed to the processing region can be achieved by selecting a lower plate 210 that has a desired thickness (e.g., thickness in the Z-direction) or by selecting conductive rods and electrode shields that have a desired length. Also, the surface area A2 of the reference electrode element can be adjusted and configured to achieve a desired ratio between areas A1 and A2.

FIG. 2J is a cross-sectional view of another embodiment of a discrete electrode 165 that can be used to control the area ratio between area A1 and area A2. In one configuration, the discrete electrode 165 includes electrode shield 168 that has a laterally configured tip portion 273 that is wider than the configuration of the electrode shield tip 168A portion of the electrode shield 168 shown in FIG. 2I. The electrode shield 168 includes sidewalls 272, flattened bottom tip portion 273, and interior portion 274 having interior sidewall 276 and interior bottom surface 275. Conductive rod 166 is attached to, or is formed with, a conductive tip 290 that has a desired shape and size (e.g., surface area). The conductive tip 290 is generally configured to generate a desired local plasma uniformity and plasma density within the processing region 110 by desirably distributing the generated electric fields created during processing due to its shape and its position within the discrete electrode 165 and position relative to the reference electrode element 225A. In one configuration, the conductive tip 290 has a greater lateral area (i.e., X-Y plane illustrated in FIG. 2H) than the conductive rod 166. The conductive tip 290 may be formed of a metal (e.g., copper, aluminum, nickel, silver, titanium or alloys thereof) or other useful conductive material. In one embodiment, the conductive tip 290 may be formed from the same conductive material as the conductive rod 166. In one embodiment, the conductive tip 290 is formed from a conductive material different from the conductive rod 166.

In some embodiments, to assure that the conductive rods 166 and the conductive tips 290 have a consistent relationship to the electrode shield 168 and lid assembly 200, a spring assembly 280 is provided to apply pressure to the conductive rod 166 and the conductive tip 290 so that the conductive tip 290 is at least in contact with the interior bottom surface 275 of tip portion 273 of the electrode shield 168. In embodiments, the electrode shield 168 includes an upper shield portion 271 that rests on a surface of the lower plate 210 to reliably fix the position the interior bottom surface 275 relative to the reference electrode element 225A. In one configuration, as shown in FIG. 2B, the upper shield portion 271 of an electrode shield rests on an O-ring 169 that rests on a surface of the lower plate 210. Thus, the configuration of the spring assembly 280, conductive rod 166, conductive tip 290, electrode shield 168 and position of the supporting surface of the lower plate 210 is used to provide a consistent orientation and position (e.g., Z direction) of the conductive tip 290 relative to the reference electrode element 225A and the processing region 110 of the processing chamber.

FIG. 2K is a close up illustration of the conductive tip 290 shown in FIG. 2J. Conductive rod 166 fits within receptacle 294 of electrode conductive tip 290. Lower curved regions 292 provide an exposed edge region that has a "curved edge" or shaped edge 295 that joins the lower surface 291 to the sidewall 293. The lower surface 291 combined with the shaped edge 295 provides a desirable electrode shape that includes a wide flat contact surface at the conductive tip 290. The flat contact surface can be used to maintain a solid and uniform contact across the flat interior bottom surface 275 of electrode shield 168, thereby assuring consistent lengths of the conductive rods 166 and conductive tips 290 distributed across the lid assembly 200 that have the same or similar style conductive tips 290.

Figure 2M:
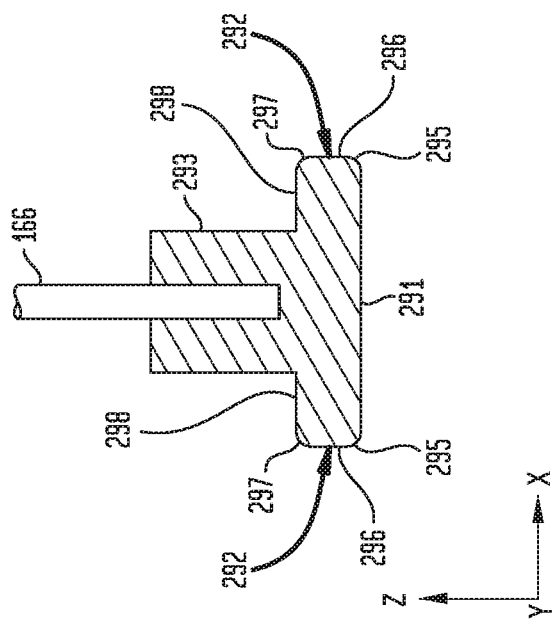
FIG. 2M is a side cross-sectional view of a portion of a discrete electrode illustrated in FIG. 2J, according to an embodiment of the disclosure provided herein.
Figure 2L:
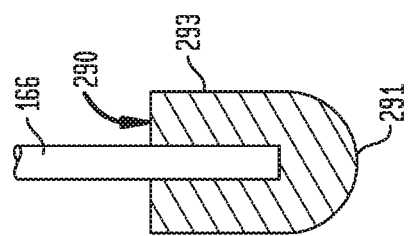
FIG. 2L is a side cross-sectional view of a portion of a discrete electrode illustrated in FIG. 2J, according to an embodiment of the disclosure provided herein.

FIG. 2L is a close-up illustration of an alternate embodiment of conductive tip 290. In this embodiment, conductive tip 290 has a lower surface 291 that has a non-flat or curved shape that is connected to sidewall 293 of the conductive tip 290. The curved shape of the lower surface 291 could be a hemispherical shape, a conical shape (not shown) or any other curved profile. The curved shape of lower surface 291 can provide a desired field shape when RF biased and/or a consistent point of contact with the interior bottom surface 275 of electrode shield 168 (e.g., avoiding parallelism issues when mating flat surfaces), thereby assuring consistent lengths of the conductive rod 166 and conductive tips 290 across the lid assembly 200 when using the same style conductive tips 290.

FIG. 2M is a close-up illustration of another alternate embodiment of conductive tip 290 as shown in FIG. 2J. In this embodiment conductive tip 290 has t-shaped configuration that has a lower surface 291, a shaped edge 295, a lower sidewall 296, a shaped upper region 297 and a joining region 298. The joining region 298 joins the shaped upper region 297 to the upper sidewall 293. The lower surface 291 combined with the shaped edge 295 provides a contact surface that can allow the conductive tip 290 to maintain solid and uniform contact across the flat interior bottom surface 275 of electrode shield 168 thereby assuring consistent lengths of the conductive rod 166 and conductive tips 290 across the lid assembly 200 when using the same style conductive tips. While not shown in FIG. 2M, in some embodiments, the lower surface 291 can have a curved shape (e.g., convex or concave shape) to provide a desired field shape when RF biased and/or a consistent point or line contact with the interior bottom surface 275 of electrode shield 168.

FIG. 2N illustrates a bottom view of an alternate embodiment of the relationship of a reference electrode element and the array of discrete electrodes shown in FIG. 2G. FIG. 2N depicts an array of discrete electrodes 165 where the relationship of the total exposed surface area of the discrete electrodes 165, or sum of the electrode surface areas A1 of the discrete electrodes 165, is approximately the same as surface area A2 of the reference electrode element 225A. The areas A1 and A2 do not include the electrode gap 287 formed between the edge of the discrete electrode 165 and the edge 288 of the reference electrode element 225A. The distance 286 across the electrode gap 287 surrounding the discrete electrodes 165 can be adjusted to control a property of a formed plasma and/or adjust the area A2 of the reference electrode element 225A. It has been found that there is an increased consistency of the plasma density and plasma uniformity when using configurations that have a total area of the discrete electrodes 165, or sum of the areas A1 of the discrete electrodes 165, is the same as the area A2 attributed to the lateral surface area (e.g., parallel to X-Y plane illustrated in FIGS. 2A and 2N) of reference electrode element 225A facing the processing region. In one example, the ratio of the sum of the electrode surface areas A1 to the surface area A2, which faces the processing region, is between a ratio of 0.8:1 and 1.2:1. In another example, the ratio of the sum of the surface areas A1 to the surface area A2, which faces the processing region, is between a ratio of 0.9:1 and 1.1:1.

Referring back to FIG. 2A, in some embodiments, the thermal control conduits 250A and 250B are operably coupled to a temperature control system (not shown). The temperature control system includes a temperature controller (not shown) that is in communication with the system controller 50. The system controller 50 is generally designed to facilitate the control and automation of the process chamber 100 and may communicate with the various sensors, actuators, and other equipment associated with the process chamber 100. The system controller 50 typically includes a central processing unit (CPU) (not shown), memory (not shown), and support circuits (or I/O) (not shown). The CPU may be one of any form of computer processors that are used in industrial settings for controlling various system functions, substrate movement, chamber processes, and control support hardware (e.g., sensors, internal and external robots, motors, gas flow control, etc.), and monitor the processes performed in the system (e.g., RF power measurements, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 50 determines which tasks are performable on a substrate in the process chamber 100. Preferably, the program is software readable by the system controller 50 that includes code to perform tasks relating to monitoring, execution and control of the movement, support, and/or positioning of a substrate along with the various process recipe tasks and various chamber process recipe operations being performed in the process chamber 100.

The temperature control system may include temperature sensors that are in communication with the temperature controller. The temperature sensors may be positioned within the body 201 to monitor temperature of the body 201 of the lid assembly 200. In some embodiments, the chamber body 105 includes a temperature control conduit that is coupled to the temperature controller. The temperature controller may include servo controllers that control electrical power to the resistive heater and flow control of fluids to the thermal control conduits 250A. In operation, a set-point temperature for the lid assembly 200 may be provided by the system controller 50 to the temperature controller based on feedback from one or more of the temperature sensors. Embodiments of the temperature control system can be used to provide uniform temperature of the lid assembly 200 during cycling between the plasma-on state and the plasma-off state. Maintenance of the process set-point temperature may result in more stable process results within a single substrate process as well as substrate to substrate processing. In this manner, temperature control of the lid assembly 200, and processing temperature, is reliably controlled. Embodiments of the temperature control system as described herein may be utilized to maintain a set-point temperature of about 120 degrees Celsius to about 160 degrees Celsius.

Referring back to FIGS. 1A-1B, the lower chamber assembly 30 includes a chamber body 105 and a support assembly 115. The support assembly 115 may include an electrode 464 that can be biased by use of a supporting RF source assembly 460. The supporting RF source assembly 460 includes an RF power supply 461 and RF match 462 that are configured to provide RF power to the electrode 464 a frequency between about 50 kHz and 200 MHz, such as between about 13.56 MHz and about 162 MHz, or even between about 50 MHz and about 162 MHz. The supporting RF source assembly 460 may also include a switching device 469 that is disposed between the electrode 464 and the RF power supply 461, such as between the electrode 464 and the RF match 462. The switching device 469 may include an RF coaxial vacuum relay that has high impedance when in its open state and a low impedance in its closed state, as discussed further below. The electrode 464 can thus be used in conjunction with the discrete electrodes 165 to form a plasma in the processing region 110. The RF power supplied to the electrode 464 may be adjusted, along with the position of the substrate 112 relative to the discrete electrodes 165 and/or the RF power provided to the discrete electrodes 165, to control the interaction of the formed plasma (e.g., amount of radical and/or ion interaction) with the exposed surfaces of the substrate 112. The support assembly 115 may be a vacuum chuck, an electrostatic chuck, or other type of substrate support that may be made of a thermally conductive material, such as aluminum or aluminum nitride.

The chamber body 105 includes a chamber liner 107 that is configured to separate the processing region 110 from the lower chamber region 430. The chamber body 105 includes a plurality of chamber side walls 405, and chamber floor 410 that can be formed from one or more process-compatible materials, such as aluminum, anodized aluminum, nickel plated aluminum, nickel plated aluminum 6061-T6, stainless steel, as well as combinations and alloys thereof, for example. The plurality of chamber side walls 405 and chamber floor 410 are configured to support one more of the components contained within the upper chamber assembly 20 and allow a desirable pressure to be maintained within the processing region 110, lower chamber region 430 and evacuation region 411 by use of a pump 440. In one example, the pump 440 includes a turbo pump and/or mechanical pump that is able to generate a vacuum pressure within processing region 110, lower chamber region 430 and evacuation region 411. In one processing example, a vacuum pressure is maintained within processing region 110, during plasma processing of a substrate 112, to a pressure between about 10 mTorr and 10 Torr, such as between about 100 mTorr and 10 Torr.

The chamber body 105 also includes a load port (not shown) formed in one of the side walls 405. Then load port is selectively opened and closed by a slit valve (not shown) to allow access to the interior of the chamber body 105 by a substrate handling robot (not shown). A substrate 112 can be transferred in and out of the process chamber 100 through the load port to an adjacent transfer chamber (not shown) on which the process chamber 100 is disposed and/or load-lock chamber, or another chamber within a cluster tool in which the process chamber 100 resides. The support assembly 115 may be movable relative to the chamber body 105. A substrate 112 may be disposed on the upper surface 130 of the support assembly 115 for processing. The support assembly 115 may be in a position adjacent to the load port for substrate transfer. The support assembly 115 may also move to a position in proximity to the lower surface 126 of the lid assembly 200 for processing. The support assembly 115 may also be rotatable relative to the chamber body 105. Lift pins (not shown) may also be used to space the substrate 112 away from the upper surface 130 of the support assembly 115 to enable exchange with the substrate handling robot during substrate transfer.

As shown in FIG. 1A, the side walls 405 and the chamber floor 410 enclose an evacuation region 411. The vacuum pump 440 is disposed in a vacuum pump opening 410a in the chamber floor 410 and is centered relative to the axis of symmetry of the side walls 405. A containment wall 415 coaxial with the support assembly 115 and a flexible bellows 417 extending between the pedestal 120 and the containment wall 415 enclose the support assembly 115 in an internal central space 419. The central space 419 is isolated from the volume evacuated by the vacuum pump 440, including the evacuation region 411 and the processing region 110. Referring to FIG. 1B, there are three hollow radial struts 420 defining radial access passages 421 spaced at 120 degree intervals extending through the chamber body side wall 405 and providing access to the central space 419. Three axial exhaust passages 422 are defined between the three radial struts 420. Different utilities may be provided through different ones of the radial access passages 421, including the RF power cable or rigid RF transmission line 132 connected to the electrode 464, heater voltage supply lines connected to heater elements in the support assembly 115, an electrostatic chucking voltage supply line connected to the electrode 464, coolant supply lines and helium supply lines for backside helium gas channels in the workpiece support surface 121, for example. A workpiece support lift actuator 450 is fixed with respect to the chamber body and moves the support assembly 115 vertically (e.g., Z-direction) by use of a mechanical actuator (not shown). The workpiece support lift actuator 450 can thus be used to control the electrode-to-substrate spacing 213 (FIG. 2B) by use of commands received from the system controller 50. Varying this distance varies the distribution of plasma ion density within the formed plasma 111. Movement of the lift actuator may be used to improve uniformity of distribution of process (e.g., etch) rate across the surface of the substrate 112. Varying this distance may also be used to vary the ratio of plasma ion or electron density with respect to plasma radical density at the workpiece. In some embodiments, it is desirable to adjust the electrode-to-substrate spacing 213 during different portions of a plasma processing recipe performed on a substrate so that the amount of exposure of the surface of the substrate to ions and/or radicals formed in the plasma can be adjusted. In one example, it is desirable to position the surface of the substrate closer to the discrete electrodes 165 during a first process step to allow the substrate to be exposed to a first amount of ions generated in the plasma, and then position the surface of the substrate a distance further away from the discrete electrodes 165 during a second process step to allow the substrate to be exposed to a second amount of ions generated in the plasma. In this example the second amount of ions that the substrate surface is exposed to will be less than the first amount ions the substrate surface is exposed to during the first process step. In another example, the spacing between the substrate and the discrete electrodes 165 is reversed from the previous example by switching the order of the processing steps during processing in order to alter the exposure of the substrate surface to the amount of generated ions. The lift actuator 450 may be controlled by the user through system controller 50, for example.

The axially centered exhaust assembly including the vacuum pump opening 410a and the axial exhaust passages 422 avoids asymmetries or skew in processing distribution across the substrate 112. The lower annular grid 107B masks the processing region 110 from the discontinuities or effects of the radial struts 420. The combination of the axially centered exhaust assembly with the symmetrical distribution of RF current flow below the ground plate 184 minimize skew effects throughout the processing region 110, and enhance process uniformity in the processing region 110.

In one embodiment, the upper chamber assembly 20 includes a magnet assembly that includes an electromagnet 176 that is powered by a magnet source 177. The magnet assembly may be an axisymmetric or cusp type magnet system that creates a B-field with peak fields at the edge or in the center of the process chamber. Alternately, the magnet assembly may include an "X-Y" coil assembly (e.g., two or more coils) that provides a magnetic field that can be directed across the surface of the substrate in an arbitrary direction parallel to the surface of the substrate by use of a combination of currents provided through the desirably oriented coil(s) found in the "X-Y" coil assembly. The ability to alter the generated magnetic field can be useful to compensate for an asymmetry in the plasma formed by the components found in the electrode assembly 160. The ability to alter the generated magnetic field can also be useful to correct for any asymmetry in a property of the substrate (e.g., existing thickness non-uniformity) that is to be processed in the process chamber, or to deliberately create an asymmetry in the process results performed on the substrate in the process chamber in anticipation of a skew in the process results found in a subsequent process step performed on the substrate. The magnet assembly may be used to tune the plasma properties so as to alter one or more process variables, such as etch rate or deposition rate. For example, at high RF frequencies, such as 162 MHz the magnets may be utilized to reduce a peak in the plasma density found near the center of the substrate 112. In some embodiments, lower RF frequencies (e.g., about <60 MHz) may not need magnets to tune the generated plasma.

RF Power Delivery Configuration Examples

Figure 3A:
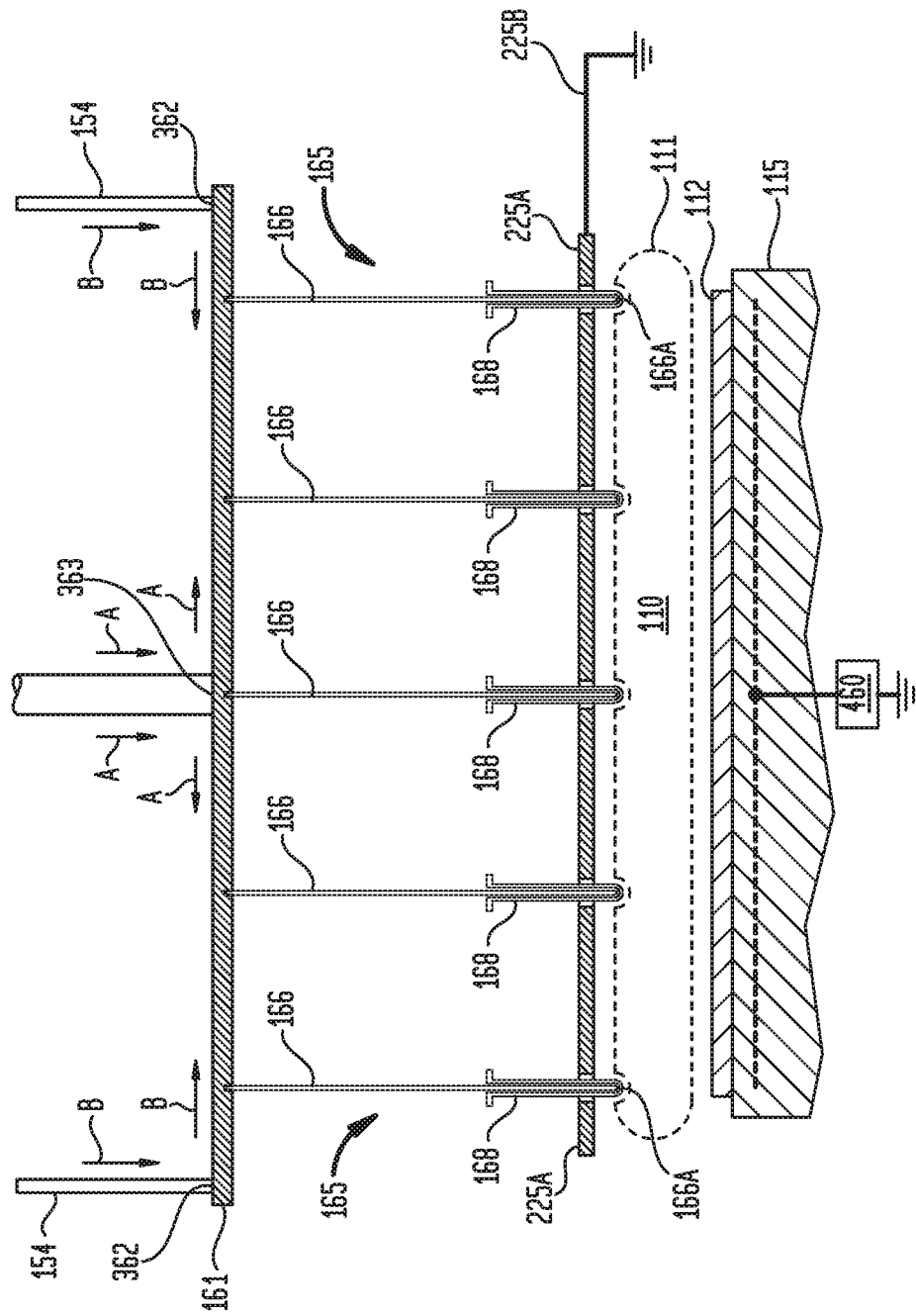
FIG. 3A is a side schematic cross-sectional view of a portion of the lid assembly, according to an embodiment of the disclosure provided herein.

FIG. 3A is a cross-sectional view of the main RF power delivery elements disposed within the electrode assembly 160 of the lid assembly, according to an embodiment of the disclosure provided herein. The electrode assembly 160 includes the connecting elements 154 and a center connecting element 155 that are coupled to the conductive rods 166 through the power distribution element 161. The conductive rods 166 are configured to be biased relative to a reference electrode, such as the reference electrode element 225A or process chamber walls (not shown) by use of the RF power generation components found in the RF source assembly 150. During processing, an RF current "A" is provided from a RF source that is coupled to the connecting element(s) 155 and a RF current "B" is provided from a RF source that is coupled to the connecting elements 154. As is further discussed below, the RF source providing power to the connecting elements 154 and 155 may be the same RF source or different RF sources. By controlling the characteristics of the RF power delivered through each of the connecting elements 154, 155 and by use of the structural aspects of the RF power conducting elements, such as the power distribution element 161 and conductive rods 166, the uniformity of the RF power that is provided to the processing region 110 and thus generated plasma 111 can be controlled. In some embodiments, the physical characteristics of the RF power distribution components in the electrode assembly 160 and/or the position where the connecting elements 154, 155 contact the power distribution element 161 are configured so that the RF power provided by the RF source(s) has a desired generated wave pattern based on the interference created between the RF power provided to the different power delivery elements within the electrode assembly. In some embodiments, the electrical characteristics of the RF power provided to the connecting elements 154, 155 and power distribution element 161 (e.g., phase angle, frequency, power) are adjusted so that the RF power provided by the RF source(s) is able to achieve a desired wave pattern and forward RF power signal based on the impedance of the driven components, load created by the plasma and the interference created between the RF power provided separately to different parts of the power delivery elements found within the electrode assembly.

FIG. 3B is a cross-sectional view of another configuration of the main RF power delivery elements disposed within the electrode assembly 160 of the lid assembly. The configuration illustrated in FIG. 3B differs from the configuration illustrated in FIG. 3A in that the connection point 363 of a connecting element, such as connecting element 155 shown in FIG. 3A, can be adjusted during manufacturing of the process chamber 100 or while the process chamber is installed in the field by use of a connection assembly 330 that couples an end of a connecting element to a portion of the power distribution element 161. In one embodiment, the connection assembly 330 includes a distribution plate 331 that includes a plurality of connecting features 332 that are each configured to accept an end of a conductive connecting element 341 that is coupled to a portion of the power distribution element 161 at its opposing end. In some configurations it is desirable to position one or more of the conductive connecting elements 341 in a connecting feature 332 so that the one or more conductive connecting elements 341 are a distance 335 from a symmetric position of the power distribution element 161 (e.g., center point of the power distribution element). The distance 335, or spacing of the features 332, may be configured to minimize non-uniformity for a particular load condition and driven RF frequency. The ability to adjust the physical position of one or more connection points made between a connecting element 154, 155 and the power distribution element 161 can be used to compensate for and/or create a desired asymmetry in the plasma formed in the processing region 110 by altering the generated wave pattern formed in the power distribution element 161.

The plurality of discrete electrodes 165, the power distribution element 161, and the reference electrode 225B are depicted as a loaded transmission line system 190 in FIGS. 4A-4B, 5A-5B, 6A-6B and 7A, which are further described below. The reference electrode 225B may include the reference electrode element 225A and/or grounded process chamber walls. In another embodiment, the reference electrode 225B is formed from a portion of the plurality of discrete electrodes that are separately grounded versus the reference electrode element 225A, as previously discussed.

FIG. 4A is a schematic depicting an embodiment of the RF source assembly 150 for driving the plurality of discrete electrodes 165. The RF delivery assembly 150 includes an RF generator 351, a matching network 355, and connecting elements 154, 155. The power distribution element 161, the plurality of discrete electrodes 165, and the reference ground of FIG. 3A are depicted as a transmission line system 190 loaded with a plurality of impedances 365 that schematically represent the impedance created when a plasma is generated in the processing region 110 by the delivery of RF power to the discrete electrodes 165. The plurality of impedances 365 are generally complex impedances $(Z(f)=R(f)+j(X_L(f)+X_C(f)))$ that vary as the amount of RF power at a driven frequency and phase are adjusted or vary during the formation of a plasma within the processing region 110. The impedances 365 typically include a resistive component R, an inductive component $X_L$ and a capacitive component $X_C$. A junction 361 connects the output of the matching network 355 to the power distribution element 161 using the connecting elements 154, 155. For simplicity of discussion, in this example, the formed electrical circuit includes two connecting elements 154 and one connecting element 155, however, this configuration is not intended to be limiting as to the scope of the disclosure provided herein since additional connecting elements 154, 155 could also be used. Thus, in this example, the connecting element 155 connects the junction 361 to a connection point 246 (FIGS. 2C1-2C2) near the center of the power distribution element 161. A first connecting element 154 connects the junction 361 to a connection point 247 (FIGS. 2C1-2C2) positioned at one edge of the power distribution element, such as the left edge of the power distribution element 161. A second connecting element 154 connects the junction 361 to a connection point 247 (FIGS. 2C1-2C2) positioned at another edge of the power distribution element, such as the right edge of the power distribution element 161. In some embodiments, the distances between the junction 361 and each of the connection points 246, 247 are selected to achieve a desirable wave pattern within each of the RF power delivery components as they are driven during processing.

In general, the RF generators in the RF source assembly 150 are configured to supply RF power (voltage and/or current) to the electrode assembly 160 components. An output impedance of the RF generator 351 is matched via the matching network 355 to the impedance of the loaded transmission line system 190 to efficiently transfer power from the RF generator 351 to the loaded transmission line system 190. The matching network 355 is thus configured to provide a desired forward and reflected RF power based on the driven frequency provided from the RF generator during processing. In some embodiments, the RF power provided by the RF generators is provided in a range between about 50 kilohertz (kHz) and about 3 gigahertz (GHz). It has been found that the electrode assembly configuration(s) described herein are especially useful in configurations where the RF power is applied at frequencies greater than or equal to 13.56 MHz, such as RF power provided in the VHF range (30 MHz to 300 MHz) or UHF range (300 MHz to 3 GHz). Higher frequency RF power in the VHF or UHF range is advantageously used to provide higher plasma densities at a lower drive voltage than a lower RF frequency would provide. Use of lower drive voltages can be important to prevent or minimize the risk of arcing, which cause damage to the substrates that are being processed in the process chamber, as the plasma density is increased when using a CCP source configuration. Use of a lower drive voltage can also provide a reduced ion energy and/or narrower ion energy distribution in the generated plasma, which can provide improved process results and reduced substrate damage during processing of certain semiconductor device structures formed on the substrate surface.

During operation, the RF power provided to each of the connection points 246, 247 causes RF waves (voltage/and or current) to travel from the center to the edges, from the edges to the center and from edge to edge within the power distribution element 161. The transmitted waves constructively and destructively interfere with each other and in the steady state can in some cases generate standing waves with peaks and troughs at different positions along the power distribution element 161 and along the conducting rods 166 that are connected to the power distribution element 161. The pattern of peaks and troughs of the standing wave(s) on the power distribution element 161 and along the conducting rods 166 are an important contributor to plasma non-uniformity and relative changes in plasma density across the surface 226 of the lid assembly 200. In some applications, the interfering wave patterns created by the delivery of RF power from a single source, such as RF generator 351 and a matching network 355, may provide acceptable power distribution uniformity at the tips of the conductive rods 166 so that an acceptable plasma uniformity within the processing region 110 can be generated. However, in other applications, the physical configuration of the electrode assembly 160 components may be less than adequate, since the position and amplitude of the wave patterns is not uniform and is not easily altered by adjusting the electrical characteristics of the RF power delivered to the electrode assembly 160 components or replacement and/or reconfiguration of the physical electrode assembly 160 components.

Figure 4B:
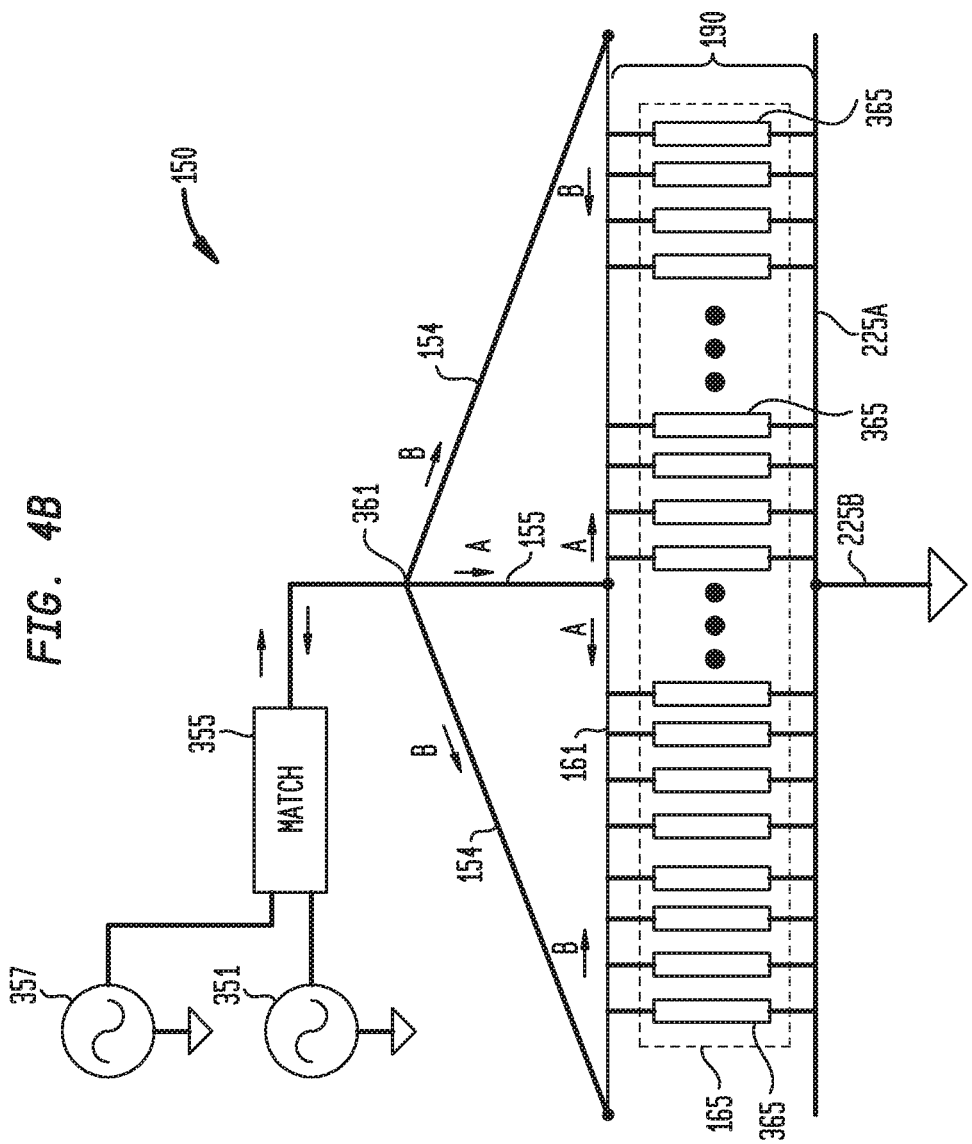
FIG. 4B is a schematic diagram depicting a system for driving the plurality of discrete electrodes using two sources of RF power, according to an embodiment of the disclosure provided herein.

FIG. 4B is a schematic depicting an embodiment of the RF source assembly 150 that includes the RF generator 351 illustrated in FIG. 4A and an additional RF generator 357. The RF generator 351 and RF generator 357 are both configured to provide RF power to the matching network 355, connecting elements 154, 155 and the electrode assembly 160. In one embodiment, the RF generator 357 is configured to deliver RF power at a frequency that is different from the frequency of the RF power provided by the RF generator 351. The matching network 355 is configured to provide a match at the two different RF frequencies provided by the two RF generators. In some embodiments, the frequency differences of the RF power provided by the RF generator 351 and the RF generator 357 are significantly different, such as tens or a hundred megahertz apart. In one example, the RF generator 351 is configured to provide RF power at 13.56 MHz and the RF generator 357 is configured to provide RF power at 2 MHz. In one embodiment, the RF generator 351 is configured to provide RF power at a first UHF or VHF frequency and the RF generator 357 is configured to provide RF power at frequency below a VHF frequency. In one example, the RF generator 351 is configured to provide RF power at 60 MHz and the RF generator 357 is configured to provide RF power at 2 MHz. In another example, the RF generator 351 is configured to provide RF power at 162 MHz and the RF generator 357 is configured to provide RF power at 13.56 MHz.

FIG. 5A is a schematic depicting an embodiment of the RF source assembly 150 for driving the plurality of discrete electrodes 165 so as to provide a desired plasma uniformity within the processing region 110. The RF delivery assembly in this embodiment includes an RF signal generator 530, a phase shifter 531, a phase controller 520, a first RF generator 532 and a second RF generator 533, a first three-port circulator 471 with a dummy load 475 and a second three-port circulator 472 with a dummy load 476, a first matching network 534, a second matching network 535, and a phase detector 525.

In this configuration of the RF source assembly 150, the RF signal generator 530 is connected to the input of the phase shifter 531 to supply a phase-shift control signal to at least one of the RF generators, such as RF generator 532 as shown in FIG. 5A. The phase shifter 531 receives a control signal from the phase controller 520 to adjust the phase of the phase-shifted signal. In one example, a single fixed choice of phase difference for a specific hardware configuration and plasma load condition may provide a standing wave pattern and VSWR (voltage standing wave ratio) that has an associated acceptable level of non-uniformity. In one embodiment, the phase set point is modulated over time by adjusting the control signal generated by the phase controller 320 to form a uniform standing wave pattern and lower VSWR, and thus create a more desirable level of plasma non-uniformity and desirable process results. In some configurations, the control signal generated by the phase controller 320 is modulated between a lower limit and an upper limit by use of a modulating function (e.g., linear, non-linear, time weighting function) to better control the level of plasma non-uniformity and plasma process results.

Each of the three-port circulators 471, 472, or circulators 471, 472, has a first port that receives the RF power delivered, respectively, from an RF generator 532, 533 and transfers the received RF power to a second port, which transmits the RF power to a matching network 534, 535. The third port of each circulator is connected to a dummy load 475, 476 to which any power received by the second port, such as reflected power or power received from the opposing RF generator, is provided. The dummy loads 475, 476 include resistive, inductive and/or capacitive circuit elements that have a desired impedance, and thus in some cases may include a 50Ω load, which is typically predominantly resistive in nature.

The first matching network 534 transmits, via the connecting element 155, RF power received from the first circulator 471 to a point near the center of the power distribution element 161. The second matching network 535 transmits, via connecting elements 154, RF power received from the second circulator 472 to edges of the power distribution element 161. Thus, the first and second matching networks 534, 535 respectively couple the RF generators 532, 533 and first and second circulators 471, 472 to the power distribution element 161 and thus provide a match between the impedance of the RF generators 532, 533 and circulators 471, 472 and the driven load(s), such as impedances 365.

The first and second matching networks 534, 535 may receive power that is reflected from the components in the electrode assembly 160. Some of this reflected power may be transmitted through the first and second matching networks 534, 535 to the second ports of the first circulator 471 and the second circulator 472, respectively. This power is then transferred by each of the first and second circulators 471, 472 to the respective dummy loads 475, 476 connected on the third ports of each circulator 471, 472.

Connected between the output of each matching network 534, 535 is the phase detector 525, which detects a difference in phase between the RF output (i.e., current, voltage or power) of each matching network 534, 535. The phase detector 525 may include a detector that is configured to directly measure the difference in the phase of the RF power output from the RF generators 532, 533. Alternately, the phase detector 525 may include a detection assembly that has individual sensors that are configured to detect the phase of the RF power provided from an RF generator 532, 533 and then has the capability to calculate the difference in the relative phase of the RF power output from the RF generators 532, 533 from the two signals provided by the individual sensors. A signal representing the detected phase difference is supplied to the phase controller 520, which in turn provides a signal to the control input of the phase shifter 531 which provides a control signal to an input of the first RF generators 532 to alter the relative phase of the RF power provided from the first RF generators 532 relative to the RF power provided from the second RF generators 533. This causes the RF power provided by each matching network 534, 535 to the power distribution element 161 to have a phase difference that is set by the phase shifter 531.

In operation, the RF power applied to the edges of the power distribution element 161 differs in phase from that of the RF power applied to the approximate center of the power distribution element 161. As discussed above, the RF wave emitted from the first matching network 534 and the RF wave emitted from the second matching network 535 travel towards each other and interfere constructively and destructively, resulting in what can be viewed as a standing wave on the power distribution element 161 in the steady state. However, in this embodiment, the phase controller 520 can alter the detected phase difference between the two waves, thereby altering the positions of the peaks and troughs of the generated standing wave on the power distribution element 161. By selectively positioning of the peaks and troughs or varying the position of the peaks and troughs over time within one or more of the RF transmission components and conductive rods 166 found within the electrode assembly 160, more uniformity of the plasma can be achieved.

In some embodiments, the phase of the RF power applied to the edges and approximate center of the power distribution element 161 can be continuously modulated by the phase controller 520 so that the time average of the RF power provided on the power distribution element 161 is more uniform as compared to any selected phase setting or set of selected phase settings provided by the phase controller. In one embodiment, the modulation rate is 100 Hz and in another embodiment, the rate is 10,000 Hz. In one example, the modulation rate is set between about 1 kHz and 10 kHz.

Additional control of the standing wave on the power distribution element 161 is possible by modifying the amplitude of the RF power applied to the edges and approximate center of the power distribution element to thus further improving plasma 111 and process uniformity. In some embodiments, a deliberately non-uniform center to edge RF power distribution across the power distribution element 161 can be used for a particular phase or phase range.

Figure 5B:
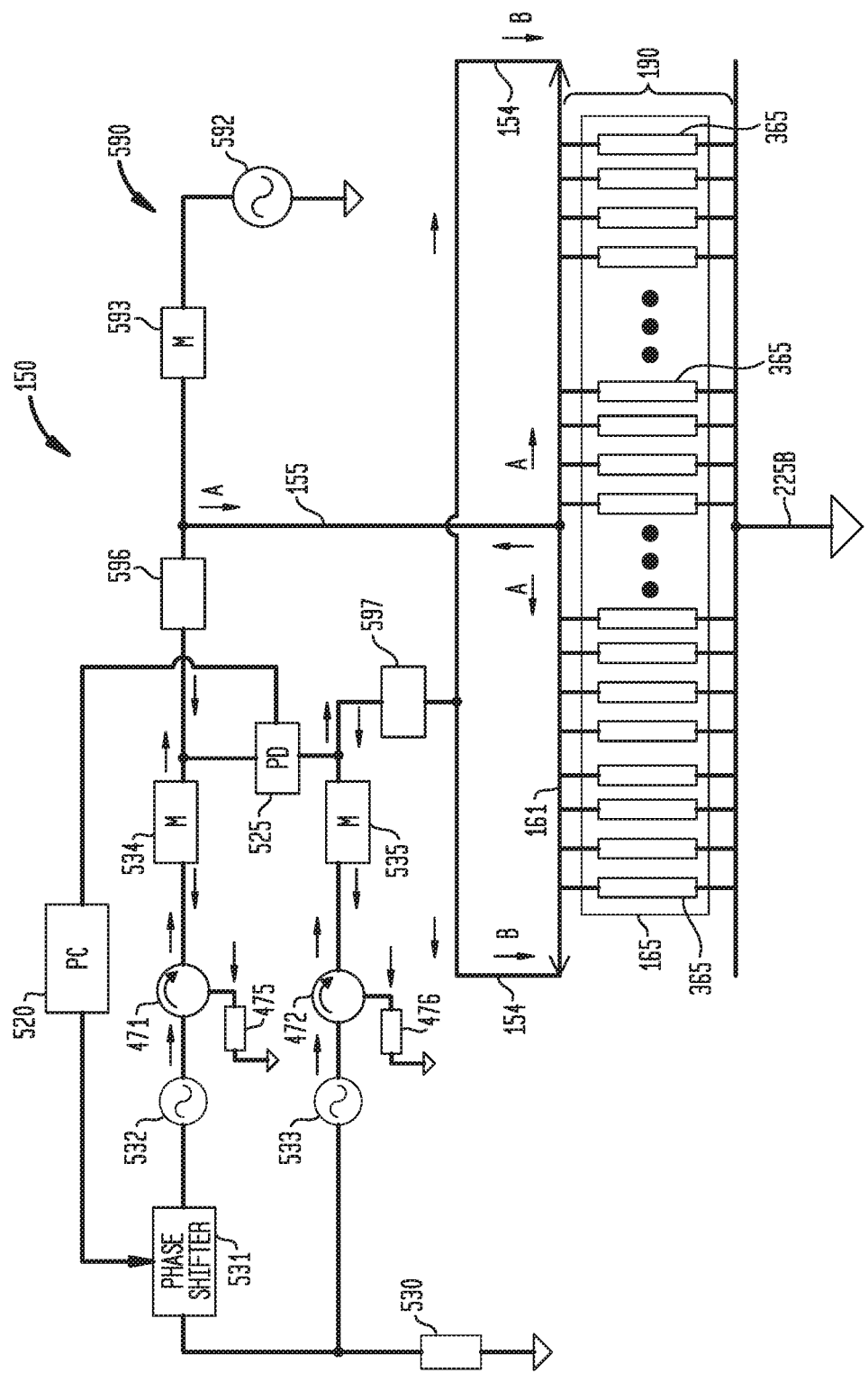
FIG. 5B is a schematic diagram depicting a system for driving the plurality of discrete electrodes using three sources of RF power, according to an embodiment of the disclosure provided herein.

FIG. 5B is a schematic depicting an embodiment of the RF source assembly 150 in which an additional RF generator assembly 590 has been added to the RF delivery components shown in FIG. 5A. The additional RF generator assembly 590 may be coupled to one of the connecting elements 154, 155 so that RF power can be additionally provided to the electrode assembly 160 at a frequency that is different from the frequency that is provided from the other connected RF generators 451 and 452, respectively. In one embodiment, the RF generator assembly 590 includes an RF generator 592 and a match 593, which is configured to provide a match at the RF frequency delivered from the RF generator 592. In one example, as illustrated in FIG. 5B, the RF generator assembly 590 is configured to deliver RF power at a frequency that is different from the frequency of the RF power provided by the RF generator 451. The frequency differences of the RF power provided by the RF generator 592 and the RF generator 451 may be significantly different, such as tens or about a hundred megahertz apart. In one embodiment, the RF generators 451 and 452 are configured to provide RF power at 13.56 MHz and the RF generator 592 is configured to provide RF power at 2 MHz. In another embodiment, the RF generators 451, 452 are configured to provide RF power a first UHF or VHF frequency and the RF generator 592 is configured to provide RF power at frequency below a VHF frequency. In one example, the RF generators 451, 452 are configured to provide RF power at 60 MHz and the RF generator 592 is configured to provide RF power at 2 MHz. In another example, the RF generators 451, 452 are configured to provide RF power at 162 MHz and the RF generator 592 is configured to provide RF power at 13.56 MHz. To avoid possibly damaging one or more of the components in the RF source assembly 150, filters 596 and 597 (e.g., high pass filters) may be used to isolate any of the components upstream of the filters from the RF power provided at the frequency delivered from the RF generator assembly 590.

FIG. 6A depicts a system for driving a plurality of discrete electrodes, in another embodiment of the disclosure provided herein. This embodiment includes first and second RF signal generators 451, 452, first and second circulators 471, 472, each with a dummy load 475, 476, first and second matching networks 455, 456, a loaded transmission line system 190 representing the plurality of discrete electrodes 165, the power distribution element 161 and the reference ground.

In this embodiment, the first RF generator 451 is connected to the first port of the first circulator 471 and the first matching network 455 is connected to the second port of the circulator. The first matching network 455 matches the second port of the circulator 471 to the transmission line system 190. The circulator 471 also transfers any reflected or received RF power to the dummy load 475 connected to the third port of the circulator 472. The second RF generator 452 is connected to the first port of the second circulator 472 and the second port of the circulator 472 is connected to the second matching network 456. The second matching network 456 matches the second port of the circulator 472 to the transmission line system 190. The circulator 472 also transfers any reflected or received RF power to the dummy load 476 connected to the third port of the circulator 472. In some embodiments, the second RF generator 452 is operated at a frequency that is different from the frequency of the first RF generator 451. In one example, the difference in frequency is between about 1 kHz and 10 MHz, such as between about 0.01 MHz and 2 MHz, or even between about 0.01 MHz and 0.5 MHz, or even between about 1 kHz and 100 kHz. For example, the first RF generator 451 is operated at a frequency of 59.9 MHz and the second RF generator 452 is operated at a frequency of 60.1 MHz.

In operation, the first matching network 455 transmits RF power to an approximately central point on the power distribution element 161 via connecting element 155. This establishes an RF wave with the first frequency traveling from the approximate center to the edges of the power distribution element 161. As the RF wave provided at the first frequency travels along the power distribution element 161, it delivers a portion of its energy to the plasma 111 through the conductive rods 166 and electrode shields 168. The remaining portion of the delivered power is transferred to the second matching network 456. At this point, any energy that passes through the second matching network 456 is provided to the reference ground, and any reflected RF power arrives at the second port of the second circulator 472 and is transferred to the third port and absorbed in the dummy load 476 connected to the third port of the circulator 472. Similar to the first matching network, the second matching network 456 transmits RF power to the edges of the power distribution element 161. This establishes an RF wave having the second frequency traveling from the edges to the other edges of the power distribution element 161 and delivering a portion of its power to the plasma. RF power at the second frequency then reaches the first matching network 455 and any power that passes through the first matching network 455 arrives at the second port of the first circulator 471, is transferred to its third port and absorbed by its dummy load 475.

In this configuration, two traveling waves of different frequencies traverse the components found in the electrode assembly 160 (e.g., power distribution element 161) in opposite directions and thus minimally constructively and destructively interfere. Thus, it is believed that by adjusting the RF power characteristics provided to different portions of the electrode assembly 160 the uniformity of the plasma 111 generated in the processing region 110 will be improved.

In some embodiments, a first travelling wave is launched from the first RF generator 451 through circulator 471 and matching network 455 is at least partially transmitted (e.g. not completely reflected) into a first connection point on the power distribution element 161 and travels across the power distribution element 161. The first travelling wave deposits at least some RF power into the plasma and at least a portion of the RF power (e.g. not completed reflected) flows out of a second connection point on the power distribution element 161. The portion of the RF power received at the second connection point is at least partially transmitted into the second matching network 456 and is partially absorbed in the resistance of the dummy load 476. Analogously, a second travelling wave launched from the second RF generator 452 through circulator 472 and second matching network 456 is at least partially transmitted (e.g. not completely reflected) into the second connection point and travels across the power distribution element 161. The second travelling wave deposits at least some RF power into the plasma and at least a portion of the RF power (e.g. not completed reflected) flows out of the first connection point. The portion of the RF power received at the first connection point is provided into the first matching network 455 and is partially absorbed in the resistance of the dummy load 475. Therefore, in one or more embodiments of the disclosure provided herein, these types of methods and hardware configurations (e.g., FIGS. 5A-7A) can be used to at least predominantly form travelling waves versus forming standing waves.

Figure 6B:
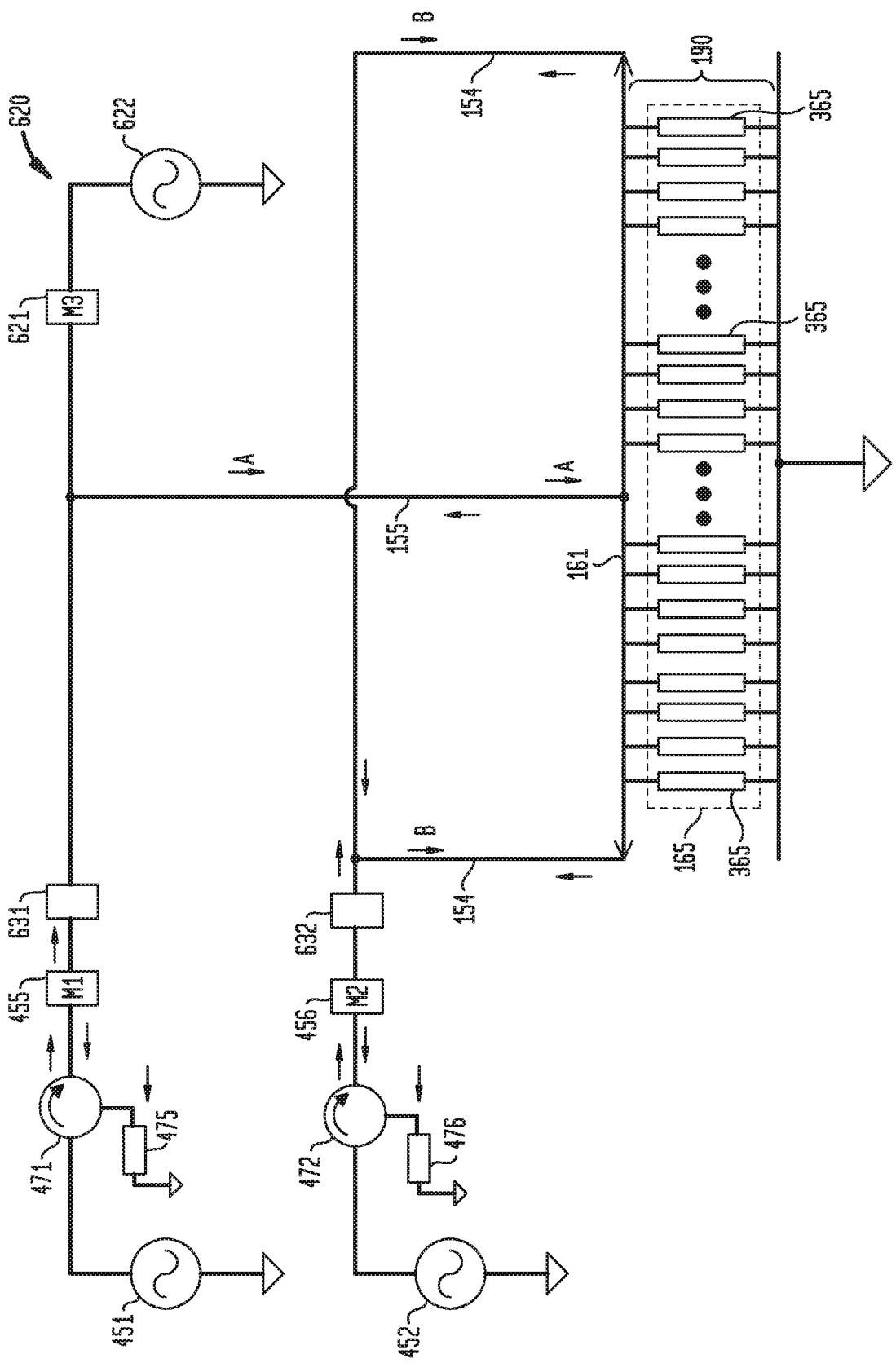
FIG. 6B is a schematic diagram depicting a system for driving the plurality of discrete electrodes using three sources of RF power, according to an embodiment of the disclosure provided herein.

FIG. 6B is a schematic depicting an embodiment of the RF source assembly 150 in which an additional RF generator assembly 620 has been added to the RF delivery components shown in FIG. 6A. The additional RF generator assembly 620 may be coupled to one of the connecting elements 154, 155 so that RF power can be additionally provided to the electrode assembly 160 at a frequency that is different from the frequency that is provided from both of the other connected RF generator 451 or 452. In one embodiment, the RF generator 620 includes an RF generator 622 and a match 621, which is configured to provide a match at the RF frequency delivered from the RF generator 622. The frequency differences of the RF power provided by the RF generator 622 and the RF generators 451 and 452 may be significantly different, such as tens or a hundred megahertz apart. In one example, the RF generators 451 and 452 are configured to provide RF power at a frequency greater than or equal to 13.56 MHz and the RF generator 622 is configured to provide RF power at 2 MHz. In one embodiment, the RF generators 451, 452 are configured to provide RF power a first and a second UHF or VHF frequency and the RF generator 622 is configured to provide RF power at frequency below a VHF frequency. In one example, the RF generators 451, 452 are configured to provide RF power at frequencies near 60 MHz and the RF generator 622 is configured to provide RF power at 2 MHz. In another example, the RF generators 451, 452 are configured to provide RF power at frequencies near 162 MHz and the RF generator 622 is configured to provide RF power at 13.56 MHz. To avoid possibly damaging one or more of the components in the RF source assembly 150, filters 631 and 632 (e.g., high pass filters) may be used to isolate any of the components upstream of the filters from the RF power provided at the frequency delivered from the RF generator assembly 620.

Figure 7A:
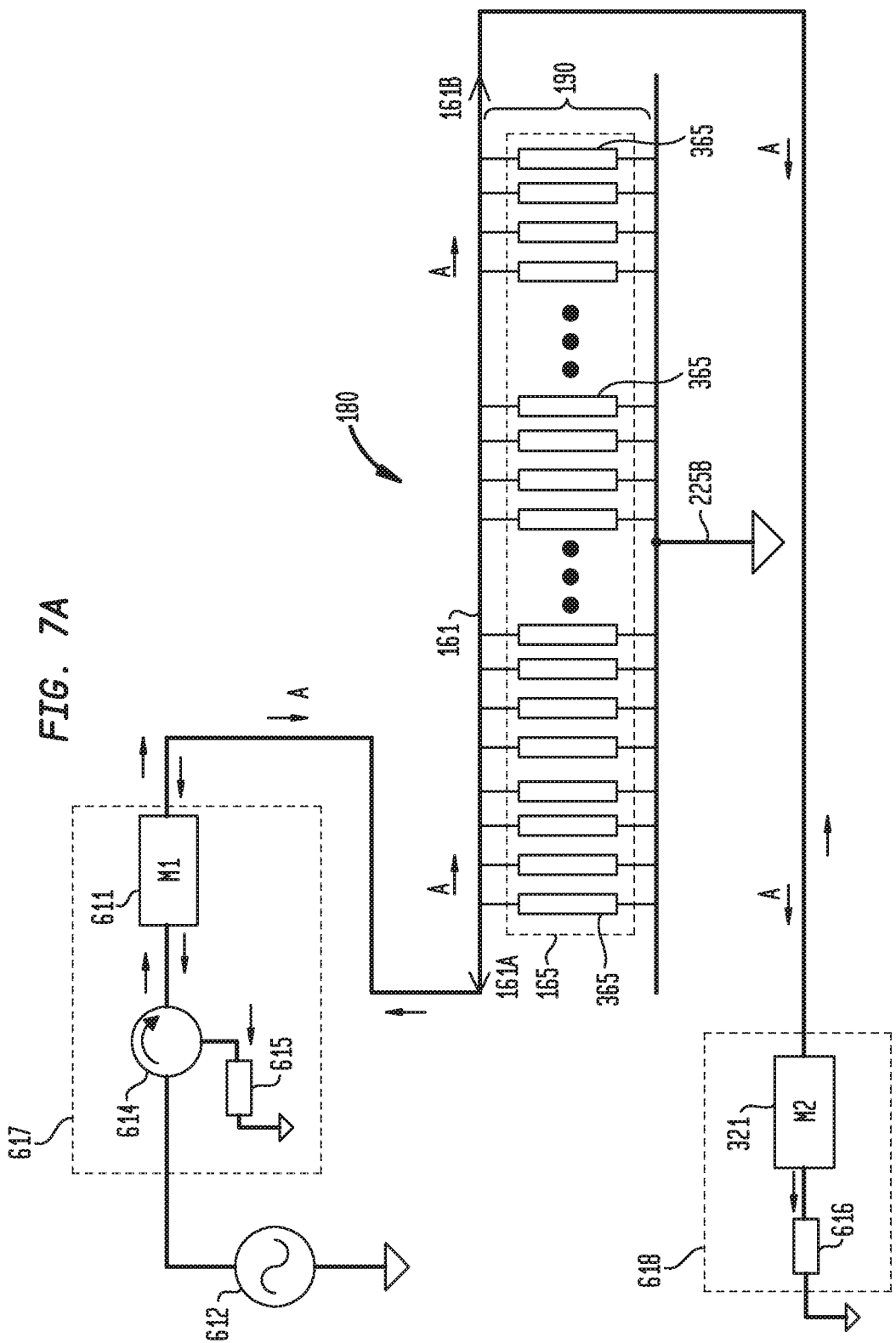
FIG. 7A is a schematic diagram depicting a system for driving the plurality of electrodes, according to an embodiment of the disclosure provided herein.

FIG. 7A depicts a system for driving a plurality of discrete electrodes, in another embodiment of the disclosure provided herein. This embodiment includes an RF generator 612, a driving component 617 that includes a circulator 614 with a dummy load 615 and a first matching network 611 and a circuit element 618 that includes a second matching network 321 with a dummy load 616. The RF generator 612 provides the RF signal to the first port of the circulator 614 whose second port provides power to the first matching network 611. The output of the first matching network 611 is connected to an edge 161A of the power distribution element to provide a transmitted wave to the power distribution element 161. The second matching network 321 is connected to another edge 161B of the power distribution element, which is terminated in a dummy load 616. The second matching network 321 could also be connected to a position between an opposing or different edge and the center of the power distribution element 161.

In operation, the first matching network 611 launches a primary traveling RF wave on the power distribution element 161 from the edge 161A to which it is connected. The primary wave traverses the power distribution element 161 in one direction to another edge 161B and arrives at the second matching network 321. Any power that passes through the second matching network 321 is absorbed by the dummy load 616. Thus, as the impedance matching between the first matching network 611 and the load (e.g., impedances 365) may not be perfect, power that would normally be reflected into the second port of the first circulator 471 is lessened or eliminated by use of the additional matching network.

In some configurations, a wave launched from the RF generator 612 through circulator 614 and first matching network 611 is at least partially transmitted (e.g. not completely reflected) into a first port (i.e., edge 161A) of the power distribution element 161. The transmitted wave then travels across the power distribution element 161, deposits at least some of the transmitted RF power into the plasma and transmits at least some of the RF power (e.g. not completed reflected) out of the second port (i.e., edge 161B) of the power distribution element 161. The RF power transmitted out of the second port is at least partially transmitted into the circuit element 618 and is partially absorbed in the resistance of the dummy load 616. This driving method, which is enabled by the use of the electrical components illustrated in FIG. 7A (e.g., two opposing matching networks), can provide improved plasma uniformity due to the use of traveling waves coupling power to plasma rather than purely standing waves that are the result of two or more traveling waves (e.g. forward and reflected waves combining and interfering) formed by more conventional RF delivery configurations.

Figure 7B:
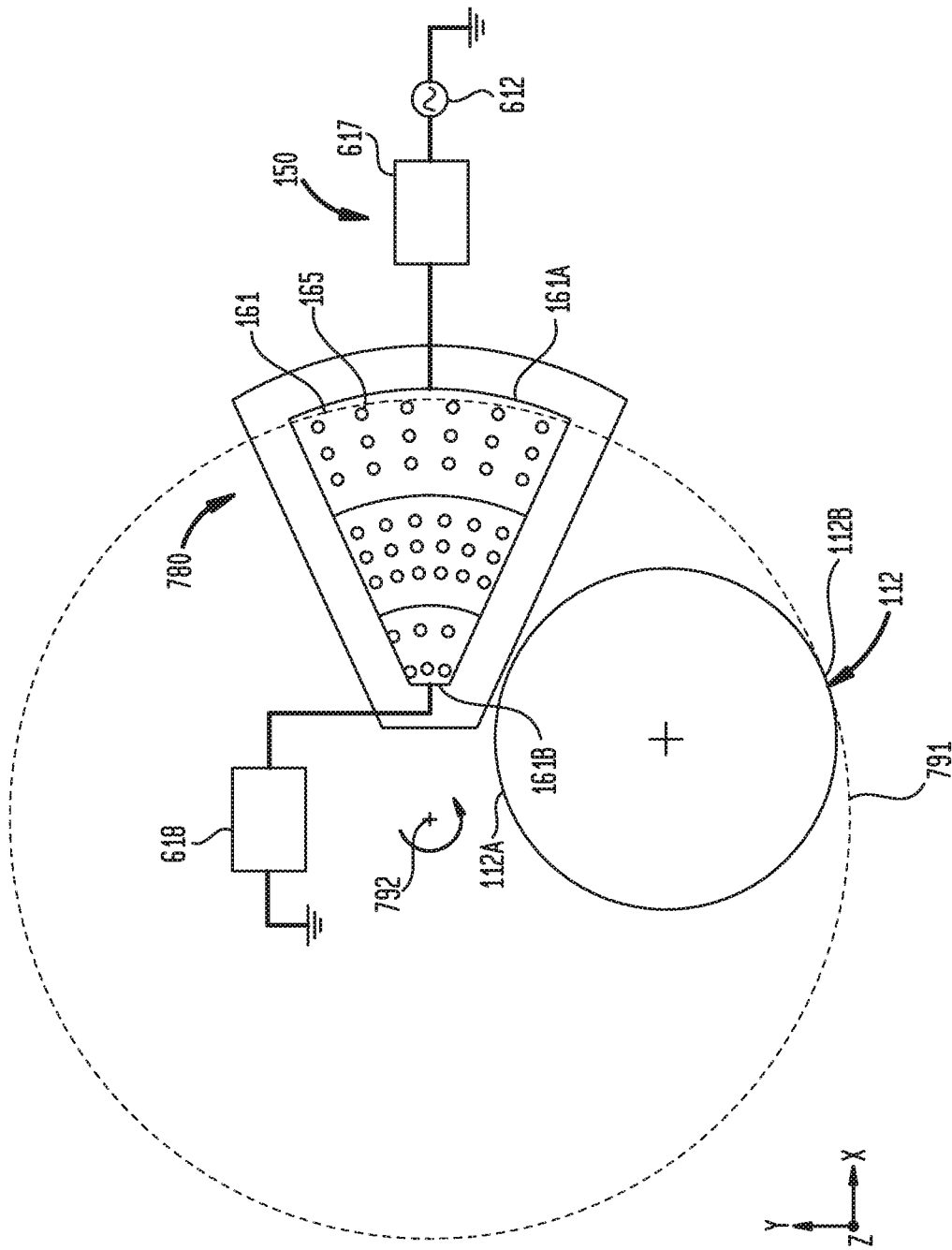
FIG. 7B depicts a physical arrangement of the power distribution element illustrated in FIG. 7A, according to an embodiment of the disclosure provided herein.

FIG. 7B depicts a bottom view of the physical arrangement of a lid assembly 780 that includes an alternate configuration of a power distribution element 161. The alternate version of the lid assembly 780 and electrode assembly 160 configurations are schematically shown in FIG. 7A. In this view, the inner edge 161B of the power distribution element 161 and the outer edge 161A of the power distribution element 161 are positioned and aligned in a radial orientation relative to the center 792 of a carousel 791, which is a substrate supporting device that is configured to transport the substrate past the lid assembly 780 as it rotates about the about the center 792 during processing. The plurality of discrete electrodes 165 are distributed in a pattern that fills the sector region defined by the angular and radial extents of the lid assembly 780. While not shown for clarity of illustration, the process chamber walls (not shown) are disposed concentric with and around the outside edge of the carousel 791, and thus, in this example, the array of discrete electrodes 165 are not symmetrically positioned relative to the chamber walls or processing region defining components. During processing the driving component 617 (shown in FIG. 7A) receives a signal from the RF generator 612 and applies it to the power distribution element 161 at the edge 161A. The signal travels along power distribution element 161 and is received at edge 161B by circuit element 618 (shown in FIG. 7A). In some embodiments, as illustrated in FIG. 7B, the edge 161A and edge 161B of the power distribution element 161 are positioned so that the edge 112A and opposing edge 112B of the substrate 112 will pass under the lid assembly 780 and power distribution components as the substrate is rotated about the center 792 of the carousel 791.

FIG. 8A depicts another system configuration for driving a plurality of discrete electrodes, in another embodiment of the disclosure provided herein. This embodiment includes an RF generator 612, a driving component 617 that includes an optional circulator 614 with an optional dummy load 615 and a first matching network 611 that are coupled to the power distribution element 161 through the center connecting element 155, and a circuit element 810 that is coupled between a reference ground and the power distribution element 161 through the four connecting elements 154. In some configurations, the circuit element 810 may include at least one of a resistor and an electrical reactance element, such as an inductor or a capacitor. In one example, the circuit element 810 includes a resistor, an inductor and a capacitor. In some configurations, the circuit element 810 includes a second matching network 321 and a dummy load 616. The RF generator 612 provides the RF signal to the first port of the circulator 614 whose second port provides power to the first matching network 611. The output of the first matching network 611 is connected to the center connecting element 155 that is coupled to the power distribution element 161 to provide RF power, which can include a transmitted wave, to the center portion of the power distribution element 161. The circuit element 810 is connected to at least one of the edge connection points of the power distribution element.

In one operational configuration, the first matching network 611 launches a primary traveling RF wave to the center of the power distribution element 161. The primary wave traverses the power distribution element 161 in an outward direction from the center to edge of the power distribution element 161 and then arrives at the circuit element 810. Any power that passes through the circuit element 810 is can be at least partially absorbed by the resistive elements disposed therein (e.g., dummy load 616) to control the delivery of RF power to the processing region. Thus, as the impedance matching between the first matching network 611 and the load (e.g., impedances 365) may not be perfect, the power that would normally be reflected into the second port of the first circulator 614 is lessened or eliminated by use of the components within the circuit element 810. In an alternate operational configuration, the impedance of circuit element 810 may be selected to affect the reflected wave amplitude and/or phase at that location, such that the combination of the forward traveling wave and reflected traveling wave combine to produce a standing wave, and the standing wave pattern along the power distribution element 161 acts on the plurality of electrodes to produce a plasma uniformity profile.

FIG. 8B depicts another system configuration for driving a plurality of discrete electrodes 165. This embodiment includes an RF generator 612, a driving component 617 that includes an optional circulator 614 with an optional dummy load 615 and a first matching network 611 that are coupled to the power distribution element 161 through at least one of the four connecting elements 154, and a circuit element 810 that is coupled between a reference ground and the power distribution element 161 through the center connecting element 155. In some configurations, as discussed above, the circuit element 810 may include at least one of a resistor and an electrical reactance element, such as an inductor or a capacitor. During processing, the RF generator 612 provides an RF signal to the first port of the circulator 614 whose second port provides power to the first matching network 611. The output of the first matching network 611 is connected to the four connecting elements 154 that is coupled to the power distribution element to provide RF power, which can include a transmitted wave, to the edge portion of the power distribution element 161. In this configuration, the primary wave traverses the power distribution element 161 in an inward direction from the edge(s) to the center of the power distribution element 161 and then is transmitted to the circuit element 810. As noted above, any power that passes through the circuit element 810 is can be at least partially absorbed by the resistive elements disposed therein (e.g., dummy load 616) to control the delivery of RF power to the processing region. In an alternate operational configuration, the impedance of circuit element 810 may be selected to affect the reflected wave amplitude and/or phase at that location, such that the combination of the forward traveling wave and reflected traveling wave combine to produce a standing wave, and the standing wave pattern along the power distribution element 161 acts on the plurality of electrodes to produce a plasma uniformity profile.

Thus, embodiments of the disclosure may provide an upper chamber assembly that includes a lid assembly 200, an electrode assembly 160, an RF source assembly 150, fluid source assembly 180, supporting RF source assembly 460 and a lower chamber assembly 30 that interoperate to form a plasma that has desirable plasma properties (e.g., degree of dissociation, gas composition, radical density or flux, plasma ion and electron density, electron temperature, ion energy distribution, etc.) due to the controlled and/or uniform delivery of RF power to the process gasses introduced into the processing region of the process chamber. By controlling the uniformity of the RF power provided to the processing region by the array of discrete electrodes 165, via one or more of the embodiments of the disclosure provided above, and controlling the process gas composition and gas properties (e.g., pressure, flow rate, flux, etc.) in the processing region, a plasma having desirable plasma properties is achieved.

FIG. 9 is a side cross-sectional view of portions of the lid assembly 200 and the electrode assembly 160, which is similar to the configuration illustrated in FIG. 2A and discussed above. The electrode assembly 160 includes a plurality of discrete electrodes 165 that are each coupled to the RF source assembly 150 through one or more power distribution elements 161. However, the process chamber 100 illustrated in FIG. 9 includes a substrate support circuit element 910 that is coupled between a biasing electrode 464 and a reference ground. In some configurations, the substrate support circuit element 910 may include at least one of a resistor and an electrical reactance element, such as an inductor or a capacitor. In one example, the circuit element 910 includes a resistor, an inductor and a capacitor. In some configurations, the circuit element 910 includes a second matching network 321 and a dummy load 616. The circuit element 910 and the electrode 464 can thus be used in conjunction with the discrete electrodes 165 to form and/or adjust properties of a plasma 111 formed in the processing region 110. The RF power flowing through the electrode 464 to the reference ground can be adjusted by adjusting the impedance of one or more of the circuit components in the circuit element 910, along with the position of the substrate 112 relative to the discrete electrodes 165 and/or the RF power provided to the discrete electrodes 165, to control the interaction of the formed plasma (e.g., amount of radical and/or ion interaction) with the exposed surfaces of the substrate 112. In one application where it is beneficial to minimize the energy of ions impacting the exposed surfaces of the substrate 112, the ratio of the sum of the surface areas A1 of the discrete electrodes 165 to the reference electrode element surface area A2 is selected to be nearly 1 (i.e., between 0.8 and 1.2, or preferably between about 0.9 and 1.1) and the impedance at the generator frequency from the substrate 112 back through electrode 464 to the reference ground is maximized, by selecting a value(s) for circuit element 910. In one configuration, the circuit element 910 is a filter circuit. In an alternate configuration, the circuit element 910 is a switch or relay that is opened during certain steps of plasma processing and closed during other steps. While electrode 464 is schematically shown as a single line in FIG. 9, it is understood that electrode 464 may comprise one or more layers of electrode, heating element, temperature sensor or other conductive material.

In some embodiments, the process chamber 100 may also include an RF switching device 469 that is disposed between the electrode 464 and the circuit element 910. The RF switching device 469 may include an RF coaxial vacuum relay that has high impedance when in its open state and a low impedance in its closed state. The RF switching device 469 can be used to electrically isolate the substrate 112 from ground to minimize, or substantially eliminate, the bombardment of the substrate surface by ions generated in the plasma 111 during one or more portions of the plasma process. Bombardment of the substrate surface by the plasma generated ions can cause unwanted damage to portions of the substrate surface. During at least a portion of the plasma process performed on the substrate 112 the RF switching device 469 is set to its open state to electrically isolate the electrode 464 from ground. The high impedance electrical characteristics of the RF switching device, such as an impedance of greater than 100 Ohms at the fundamental RF drive frequency and its harmonic series (e.g., at least the $2^{nd}$ and $3^{rd}$ harmonics), allows the substrate 112 and electrode 464 to substantially electrically float while the RF switching device is positioned in its open state. One suitable example RF switching device, an RF coaxial relay, has an open-state capacitance across the contacts of 3 pF, which at an RF generator drive frequency of 40.68 MHz has an impedance (e.g., capacitive reactance) of over 1200 ohms.

In some embodiments, during processing a sequentially pulsed RF bias is provided to the discrete electrodes 165 relative to the reference electrode 225B to generate the plasma 111 in the processing region 110. The pulsed RF bias can include an RF "on" state and an RF "off" state, which each have a desired duration. In one plasma processing example, the RF switching device 469 is controlled to its open state when the pulsed RF bias is in the RF "on" state (e.g., RF energy is applied to the discrete electrodes 165 in the electrode assembly 160). In an alternate example, the RF switching device 469 is controlled to its open state during a portion of the RF "on" state pulses to reduce, but not substantially eliminate, the ion bombardment of the substrate surface during plasma processing of the substrate.

In some embodiments, the processing chamber 100 may additionally include one or more additional RF switching devices that are separately coupled to each of the additional electrical connections formed between electrical elements (e.g., pedestal heater elements (not shown), thermocouple(s) (not shown), etc.) that are coupled to the pedestal 120 and their external electrical components (e.g., power supply (not shown), thermocouple board (not shown), etc.). In this configuration, during at least a portion of the plasma process performed on the substrate 112, the one or more additional RF switching devices can be set to their open state to allow the pedestal 120 of the support assembly 115 to be substantially electrically isolated from ground during processing. Thus, in one plasma processing example, the RF switching device 469 and all of the additional RF switching devices are controlled to their open state when the pulsed RF bias is in the RF "on" state. In another example, the RF switching device 469 and all of the additional RF switching devices are controlled to their open state during a portion of the RF "on" state pulses to reduce, but not substantially eliminate, the ion bombardment of the substrate surface.

In some embodiments, the process chamber 100 may include one or more RF filters that are used to prevent the electrical elements (e.g., pedestal heater elements, thermocouple(s), etc.), which are coupled to portions of the pedestal 120 of the support assembly 115, from electrically grounding the support assembly 115.

In one example, one or more process gases are provided from the plurality of distribution channels 283 formed in the lid assembly 200 and into the processing region 110 of the process chamber 100 that is maintained at a vacuum pressure (e.g., 0.1 milliTorr to 200 Torr) by use of one or more gas delivery components found in one or more of the gas sources 243 and lower chamber assembly 30 components. In some configurations, the process chamber 100 is maintained at a vacuum pressure of between 0.1 mTorr and a 100 mTorr. The one or more process gases include gases that enable the completion of the desired plasma process that is to be performed on a substrate 112 that is disposed on the surface of the support assembly 115 during processing, and may include deposition process gases (e.g., precursor gases and carrier gas) or etching process gases (e.g., dry etching gases and carrier gases). The temperature of the process gases that are provided into the processing region 110 may also be adjusted by controlling the temperature of the lid assembly 200 components by use of the temperature control system that is described above. Once a desired gas flow rate, gas pressure and/or flow distribution is achieved in the processing region 110, the components in the RF source assembly 150 are used to control the uniformity of the RF power provided to the array discrete electrodes 165, via one or more of the embodiments of the disclosure provided above. The RF bias provided to the discrete electrodes 165 relative to the reference electrode 225B (e.g., reference electrode element 225A, chamber walls and/or interleaved grounded conductive rods 166) generates a plasma 111 in the processing region 110 and the uniformity of the plasma is enhanced by phase control, amplitude control and/or frequency control of RF waves provided over the power distribution element 161 and discrete electrodes 165 according to the various embodiments disclosed herein. As discussed above in conjunction with FIGS. 2G-2H, it is believed that positioning a reference electrode element 225A proximate to the discrete electrodes 165 can provide an improved plasma uniformity across the surface 226 of the lid assembly 200 in configurations where the process chamber walls (e.g., chamber side walls 405, chamber floor 410) are not symmetrically positioned around the discrete electrodes 165 and lid assembly 200, such as the process chamber configuration illustrated in FIG. 7B. In some embodiments, the configuration of the array of discrete electrodes 165 and the distance that the ends of the discrete electrodes 165 are disposed above or below the surface 226 of the lid assembly 200 and/or reference electrode element 225A are also selected or adjusted to further improve the generated plasma properties. In this manner, the resulting plasma density and uniformity and radical generation and density are better controlled.

While the foregoing is directed to embodiments of the present disclosure, other and further embodiments of the disclosure may be devised without departing from the basic scope thereof, and the scope thereof is determined by the claims that follow.

The invention claimed is:

1. A plasma source assembly, comprising:
a reference electrode having an electrode surface, wherein the electrode surface has a central axis that is perpendicular to the electrode surface at a center point; and
an array of discrete electrodes that comprises a first zone and a second zone, the first zone and the second zone each comprise a plurality of discrete electrodes that are arranged in a pattern that is distributed in at least two non-parallel directions that are both parallel to a first plane, which is oriented in a perpendicular orientation to the central axis, wherein:
the first zone is configured to be powered by a first power distribution element;
the second zone is configured to be powered by a second power distribution element, and
each of the discrete electrodes includes an end that is disposed a distance from the electrode surface, wherein the distance is measured in a direction that is perpendicular to the first plane.

2. The plasma source assembly of claim 1, wherein at least a portion of each of the discrete electrodes in the array of discrete electrodes extends through an opening formed through the reference electrode.

3. The plasma source assembly of claim 2, wherein at least a portion of the reference electrode surrounds each of the discrete electrodes in the array of discrete electrodes.

4. The plasma source assembly of claim 1, wherein:
each of the discrete electrodes has an outer surface that has a discrete electrode surface area that comprises an area of the outer surface disposed from the end of the discrete electrode to the electrode surface of the reference electrode;
the electrode surface has a reference electrode surface area; and
a ratio of the sum of all of the discrete electrode surface areas to the reference electrode surface area is between 0.8 and 1.2.

5. The plasma source assembly of claim 1, wherein the electrode surface is planar.

6. The plasma source assembly of claim 1, further comprising:
a perforated plate having a plurality of openings formed through a perforated surface of the perforated plate, wherein the plurality of openings are arranged in a pattern that is configured to provide a desired gas flow distribution across the perforated surface when a gas is delivered through the plurality of openings, and wherein the electrode surface is parallel to the perforated surface of the perforated plate.

7. The plasma source assembly of claim 6, wherein the perforated plate comprises a material selected from a group consisting of silicon, silicon carbide, alumina, yttria, zirconia, silicon nitride, graphite, aluminum nitride and silicon dioxide.

8. The plasma source assembly of claim 1, wherein the distance of each of the discrete electrode ends is between −10 mm and 20 mm.

9. The plasma source assembly of claim 1, wherein each of the discrete electrodes within the array of discrete electrodes comprises a conductive rod that is disposed within an electrode shield.

10. The plasma source assembly of claim 9, wherein the electrode shield comprises a dielectric or semiconducting material that is selected from a group consisting of sapphire, silicon, silicon carbide, alumina, yttria, zirconia, aluminum nitride and silicon dioxide.

11. The plasma source assembly of claim 1, wherein each of the discrete electrodes within the array of discrete electrodes comprises a conductive rod that is disposed within an electrode shield that comprises a dielectric or semiconducting material, and wherein:
a portion of an outer surface of the electrode shield in each of the discrete electrodes defines the end of the discrete electrode; and
the distance of each of the discrete electrode ends is between −10 mm and 20 mm.

12. The plasma source assembly of claim 1, wherein each of the discrete electrodes within the array of discrete electrodes comprises a conductive rod that is disposed within an electrode shield and is coupled to one of the first power distribution element or the second power distribution element, and wherein the plasma source further comprises an RF distribution system that transfers RF power to each of the conductive rods by delivering RF power to at least two different points on a surface of the first power distribution element or the second power distribution element.

13. A plasma source assembly, comprising:
a reference electrode having an electrode surface, wherein the reference electrode is coupled to a ground;
a first power distribution element connected to a first plurality of discrete electrodes arranged in a first zone,
a second power distribution element connected to a second plurality of discrete electrodes arranged in a second zone, and each of the discrete electrodes includes an end that is disposed a first distance from the outer surface of the plasma source assembly in a direction that is perpendicular to the outer surface;
an RF signal generator that is configured to provide RF power to a first connection point on the first power distribution element or the second power distribution element; and
a circuit element that comprises one or more electrical reactance elements and is configured to allow a current to flow from a second connection point on the first power distribution element or the second power distribution element to the ground.

14. The plasma source assembly of claim 13, wherein the RF signal generator is configured to generate RF power at a first frequency, and the plasma source assembly further comprises:
a pedestal having a substrate supporting surface for supporting a substrate during processing, wherein the substrate supporting surface has an electrical impedance magnitude to ground, at the first frequency, that is greater than 100 ohms.

15. The plasma source assembly of claim 14, wherein:
each of the discrete electrodes has an outer surface that has a discrete electrode surface area that comprises an area of the outer surface disposed from the end of the discrete electrode to the electrode surface of the reference electrode;
the electrode surface has a reference electrode surface area; and
a ratio of the sum of all of the discrete electrode surface areas to the reference electrode surface area is between 0.8 and 1.2.

16. The plasma source assembly of claim 13, wherein each of the discrete electrodes comprises a conductive rod that is disposed within a dielectric or semiconducting material containing electrode shield, and each conductive rod has a length that is aligned along the direction that is perpendicular to the surface.

17. A plasma source assembly, comprising:
a reference electrode having an electrode surface, wherein the electrode surface has a central axis that is perpendicular to the electrode surface at a center point; and
an array of discrete electrodes that are arranged in a spaced apart pattern that is parallel to a first plane, which is perpendicular to the central axis, wherein
the array of discrete electrodes comprises a first zone of discrete electrodes configured to be powered by a first power distribution element and a second zone of discrete electrodes configured to be powered by a second power distribution element,
each of the discrete electrodes comprise a conductive rod that has a first end, a second end and a body disposed between the first end and the second end, and
each of the discrete electrodes includes an end that is disposed a distance from the electrode surface, wherein the distance is measured in a direction that is perpendicular to the first plane.

18. The plasma source assembly of claim 17, wherein at least a portion of each of the discrete electrodes in the array of discrete electrodes extends through an opening formed through the reference electrode, and at least a portion of the reference electrode surrounds each of the discrete electrodes in the array of discrete electrodes.

19. The plasma source assembly of claim 17, wherein the first power distribution element is a conductive plate with a plurality of slots formed through the conductive plate, wherein the plurality of slots are configured to limit current flow between adjacent regions of the conductive plate.

20. The plasma source assembly of claim 17, wherein the conductive rod is disposed within an electrode shield that comprises a dielectric or semiconducting material, and wherein:
a portion of an outer surface of the electrode shield in each of the discrete electrodes has an end;
the end of the electrode shield is disposed a distance from the electrode surface, wherein the distance is measured in a direction that is perpendicular to the first plane; and
the distance of each of the ends of the electrode shields is between −10 mm and 20 mm.

* * * * *